United States Patent
Jeon et al.

(10) Patent No.: US 10,283,186 B2
(45) Date of Patent: May 7, 2019

(54) DATA ALIGNMENT CIRCUIT OF A SEMICONDUCTOR MEMORY DEVICE, A SEMICONDUCTOR MEMORY DEVICE AND A METHOD OF ALIGNING DATA IN A SEMICONDUCTOR MEMORY DEVICE

(71) Applicant: SAMSUNG ELECTRONICS CO., LTD., Suwon-si, Gyeonggi-Do (KR)

(72) Inventors: Seong-Hwan Jeon, Hwaseong-si (KR); Kyung-Soo Ha, Hwaseong-si (KR); Jin-Seok Heo, Jeonju-si (KR); In-Dal Song, Seoul (KR); Jung-Hwan Choi, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/787,101

(22) Filed: Oct. 18, 2017

(65) Prior Publication Data

US 2018/0174636 A1    Jun. 21, 2018

(30) Foreign Application Priority Data

Dec. 21, 2016    (KR) .................. 10-2016-0175583

(51) Int. Cl.

| G11C 11/24   | (2006.01) |
|--------------|-----------|
| G11C 11/402  | (2006.01) |
| G11C 7/22    | (2006.01) |
| G11C 11/22   | (2006.01) |
| G11C 7/10    | (2006.01) |
| G11C 11/4093 | (2006.01) |

(52) U.S. Cl.
CPC ........ *G11C 11/4023* (2013.01); *G11C 7/1087* (2013.01); *G11C 7/1093* (2013.01); *G11C 7/222* (2013.01); *G11C 11/2293* (2013.01); *G11C 11/4093* (2013.01); *G11C 7/1012* (2013.01)

(58) Field of Classification Search
CPC .............. G11C 11/4023; G11C 7/1093; G11C 11/4093; G11C 7/1087; G11C 7/222; G11C 11/2293; G11C 7/1012
See application file for complete search history.

(56) References Cited

U.S. PATENT DOCUMENTS

| 7,423,928 B2 | 9/2008  | Vergnes et al. |
| 7,626,523 B2 | 12/2009 | Shin et al.    |
| 7,969,799 B2 | 6/2011  | Butt et al.    |
| 7,975,162 B2 | 7/2011  | Kim et al.     |

(Continued)

*Primary Examiner* — Mohammed A Bashar
(74) *Attorney, Agent, or Firm* — F. Chau & Associates, LLC

(57) ABSTRACT

A data alignment circuit of a semiconductor memory device including: a data sampling circuit configured to receive a data sequence and an internal data strobe signal, wherein the data sampling circuit samples the data sequence based on the internal data strobe signal to generate first and second data sequences; a division circuit configured to receive a clock signal and the internal data strobe signal, divide the clock signal to produce a divided clock signal and output an alignment control signal by sampling the divided clock signal based on the internal data strobe signal; and a data alignment block configured to receive the first and second data sequences, and the alignment control signal, and align the first and second data sequences in parallel to output internal data.

19 Claims, 20 Drawing Sheets

(56) References Cited

U.S. PATENT DOCUMENTS

| | | |
|---|---|---|
| 8,347,198 B2 | 1/2013 | Shin et al. |
| 8,575,957 B2 | 11/2013 | Pan et al. |
| 8,823,426 B2 | 9/2014 | Song |
| 2004/0240302 A1* | 12/2004 | Park .................... G11C 7/1042 |
| | | 365/230.06 |
| 2008/0126822 A1* | 5/2008 | Kim .................... G11C 7/1078 |
| | | 713/500 |
| 2013/0058174 A1 | 3/2013 | Lin et al. |
| 2015/0063008 A1* | 3/2015 | Moon .................. G11C 7/1087 |
| | | 365/154 |
| 2016/0035409 A1 | 2/2016 | Gopalan et al. |
| 2016/0172018 A1 | 6/2016 | Nam et al. |
| 2017/0270982 A1* | 9/2017 | Song ....................... G11C 7/22 |

* cited by examiner

DATA ALIGNMENT CIRCUIT OF A SEMICONDUCTOR MEMORY DEVICE, A SEMICONDUCTOR MEMORY DEVICE AND A METHOD OF ALIGNING DATA IN A SEMICONDUCTOR MEMORY DEVICE

CROSS-REFERENCE TO RELATED APPLICATION

This application claims priority under 35 U.S.C. § 119 to Korean Patent Application No. 10-2016-0175583, filed on Dec. 21, 2016 in the Korean Intellectual Property Office, the disclosure of which is incorporated by reference herein in its entirety.

Technical Field

An exemplary embodiment of the inventive concept relates to memory devices, and more particularly to a data alignment circuit of a semiconductor memory device, a semiconductor memory device and a method of aligning data in a semiconductor memory device.

Discussion of the Related Art

A variety of semiconductor memory devices have been developed. Over the years, the integration and operating speed of these devices have increased. For example, a dynamic random access memory (DRAM) has been used as a cache memory of a central processing unit (CPU) because of its integration scale and fast data writing or reading speeds. DRAMs have been used for this purpose even though they are volatile memories.

A synchronous semiconductor memory device processes data using a clock signal. To increase bandwidth, a synchronous semiconductor memory device may operate in a double data rate (DDR) mode. In this mode, data is processed at rising and falling edges of the clock signal. In other words, a bus operating with DDR transfers data on both the rising and falling edges of the clock signal. A DDR memory device may therefore double bandwidth without increasing the frequency of the clock signal. A DDR memory device may be controlled by a memory controller. For example, the memory controller may communicate with the DDR memory device and may control transmission or reception of data in the DDR mode.

SUMMARY

According to an exemplary embodiment of the inventive concept there is provided a data alignment circuit of a semiconductor memory device comprising: a data sampling circuit configured to receive a data sequence and an internal data strobe signal, wherein the data sampling circuit samples the data sequence based on the internal data strobe signal to generate first and second data sequences; a division circuit configured to receive a clock signal and the internal data strobe signal, divide the clock signal to produce a divided clock signal and output an alignment control signal by sampling the divided clock signal based on the internal data strobe signal; and a data alignment block configured to receive the first and second data sequences, and the alignment control signal, and align the first and second data sequences in parallel to output internal data.

According to an exemplary embodiment of the inventive concept there is provided a method of aligning data in a semiconductor device comprising: sampling serially input data based on a data strobe signal to provide first and second data sequences; dividing a clock signal to produce a divided clock signal and sampling the divided clock signal based on the data strobe signal to generate an alignment control signal; and aligning the first and second data sequences in parallel based on the alignment control signal to generate internal data.

According to an exemplary embodiment of the inventive concept there is provided a data alignment circuit of a semiconductor memory device comprising: a divider configured to receive a clock signal and output a divided clock signal; a flip-flop configured to receive a data strobe signal and the divided clock signal, and sample the divided clock signal based on the data strobe signal to output an alignment control signal; and a sampling circuit configured to receive the alignment control signal and a serial data sequence, and align the data sequence in parallel using the alignment control signal.

BRIEF DESCRIPTION OF THE DRAWINGS

The above and other features of the inventive concept will become more clearly understood by describing in detail exemplary embodiments thereof with reference to the accompanying drawings.

DETAILED DESCRIPTION OF THE EMBODIMENTS

Figure 1:
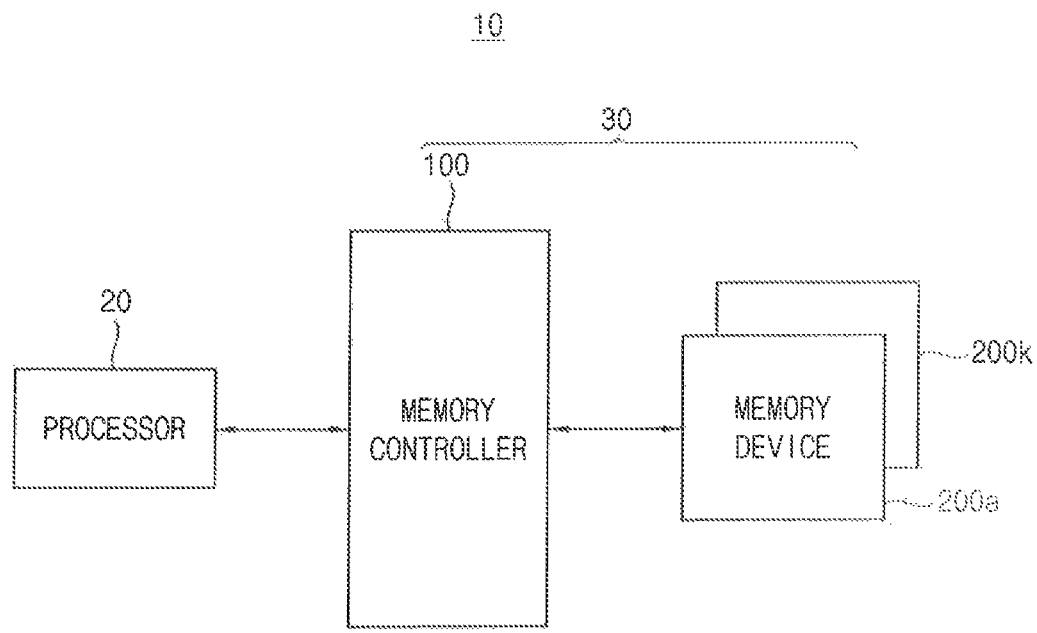
FIG. 1 is a block diagram illustrating a system according to an exemplary embodiment of the inventive concept.

Exemplary embodiments of the inventive concept will be described more fully hereinafter with reference to the accompanying drawings. Like reference numerals may refer to like elements in the drawings.

FIG. 1 is a block diagram illustrating a system according to an exemplary embodiment of the inventive concept.

Referring to FIG. 1, a system 10 may include a processor 20 and a memory system 30. The processor 20 represents a processing unit of a host computing platform that executes an operating system (OS) and applications, which can collectively be referred to as a "host" for the memory. The OS and applications execute operations that result in memory accesses. The processor 20 may include one or more separate processors. Each separate processor can include a single and/or a multicore processing unit. The processing unit may be a primary processor such as a CPU (central processing unit) and/or a peripheral processor such as a GPU (graphics processing unit). The system 10 may be implemented as an SOC, or be implemented with standalone components. The memory system 30 may include a memory controller 100 and a plurality of semiconductor memory devices 200a~200k.

The memory controller 100 represents one or more memory controller circuits or devices for the system 10. The memory controller 100 represents control logic that generates memory access commands in response to the execution of operations by the processor 20. The memory controller 100 accesses one or more semiconductor memory devices 200a~200k. In one embodiment, the semiconductor memory devices 200a~200k are organized and managed as different channels, where each channel couples to buses and signal lines that couple to multiple semiconductor memory devices in parallel.

The memory controller 100 may control an operation of the memory system 30. The memory controller 100 may control a data exchange between the processor 20 and the semiconductor memory devices 200a~200k. For example, the memory controller 100 may write data in the semiconductor memory devices 200a~200k or read data from the semiconductor memory devices 200a~200k in response to requests from the processor 20. In addition, the memory controller 100 may issue operation commands to the semiconductor memory devices 200a~200k for controlling the semiconductor memory devices 200a~200k.

In an exemplary embodiment of the inventive concept, each of the semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

Figure 2:
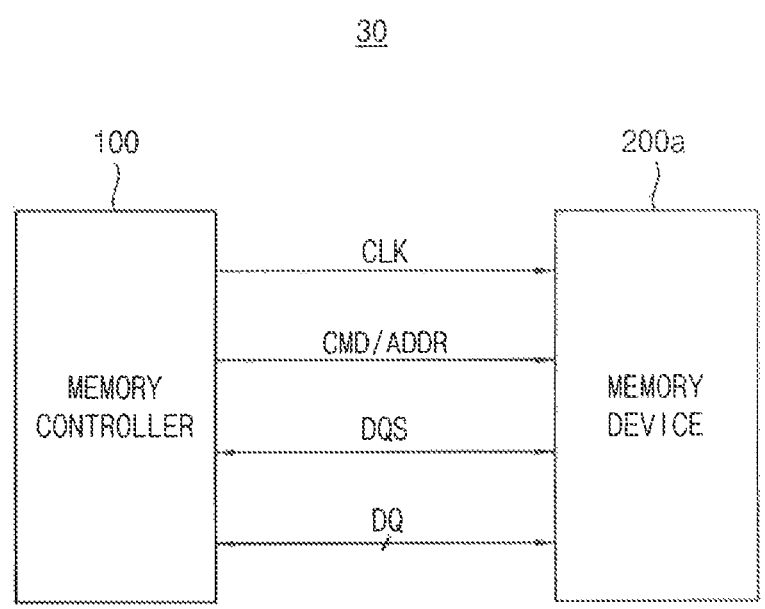
FIG. 2 is a block diagram illustrating a memory system in FIG. 1 according to an exemplary embodiment of the inventive concept.

FIG. 2 is a block diagram illustrating the memory system in FIG. 1 according to an exemplary embodiment of the inventive concept.

In FIG. 2, only one semiconductor memory device 200a in communication with the memory controller 100 is illustrated for convenience. However, the details discussed herein related to the semiconductor memory device 200a may equally apply to the other semiconductor memory devices 200b~200k.

Referring to FIG. 2, the memory system 30 may include the memory controller 100 and the semiconductor memory device 200a. The memory controller 100 transmits, to the semiconductor memory device 200a, control signals such as a clock signal CLK, a command CMD, an address ADDR, data strobe signals DQS, and data DQ, and receives the data DQ and the data strobe signals DQS from the semiconductor memory device 200a. The memory controller 100 may transmit a write command and/or a read command to the semiconductor memory device 200a.

The semiconductor memory device 200a may perform a write operation in response to the write command and may perform a read operation in response to the read command. When the semiconductor memory device 200a performs the write operation, the semiconductor memory device 200a divides the clock signal CLK, generates an alignment control signal by sampling the divided clock signal according to the data strobe signal DQS, aligns the data DQ in parallel using the alignment control signal, generates internal data and stores the internal data in a memory cell array. The data DQ may be serially input from the memory controller 100.

Figure 3:
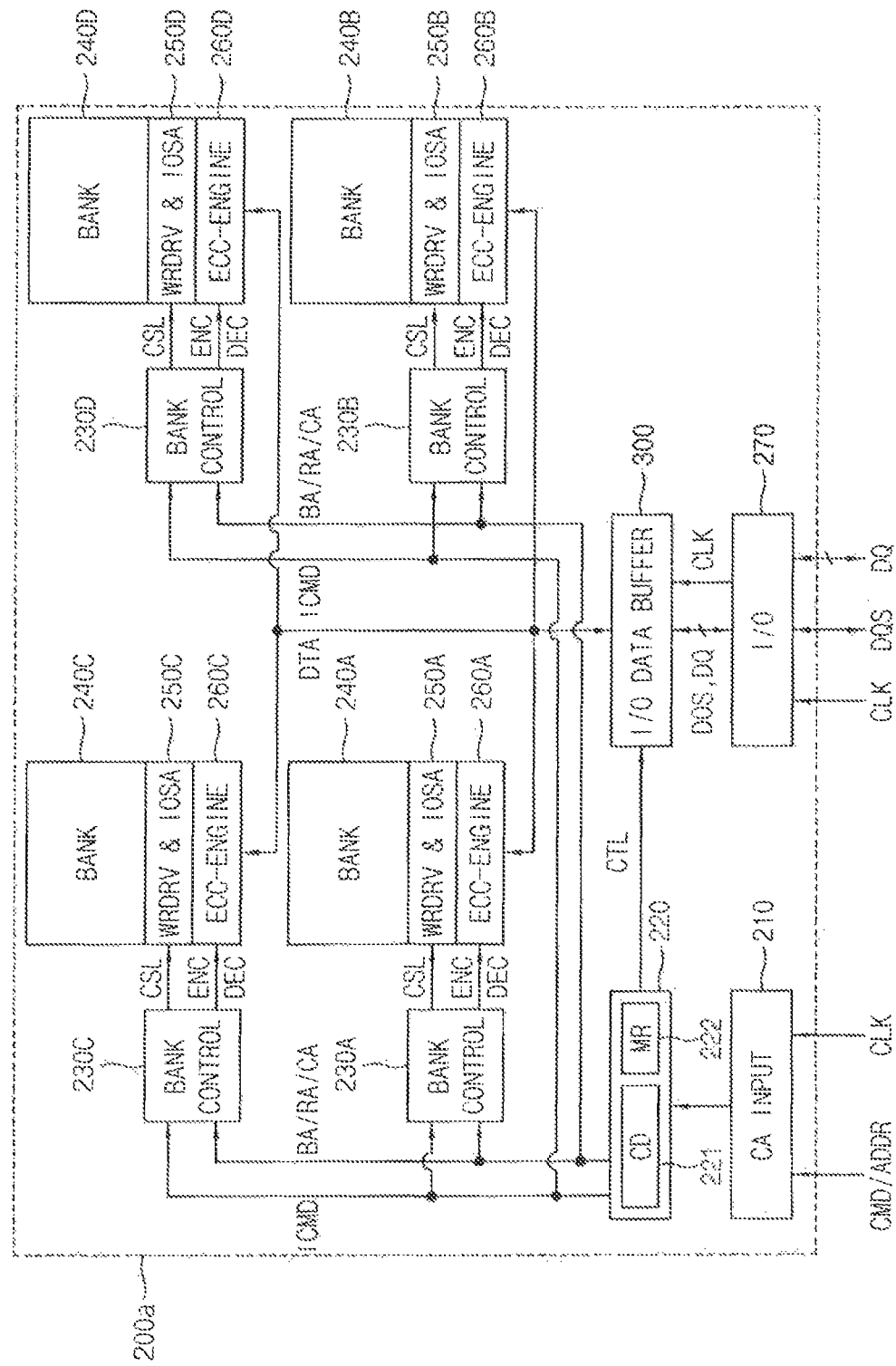
FIG. 3 is a block diagram illustrating a semiconductor memory device of the memory system in FIG. 2 according to an exemplary embodiment of the inventive concept.

FIG. 3 is a block diagram illustrating a semiconductor memory device of the memory system in FIG. 2 according to an exemplary embodiment of the inventive concept.

Referring to FIG. 3, the semiconductor memory device 200a may include a command/address input buffer 210, a control logic circuit 220, bank control logic 230A~230D, a memory cell array (of bank arrays) 240A~240D, write driver and data input/output (I/O) sense amplifiers 250A~250D, error correction code (ECC) engines 260A~260D, an I/O data buffer 300, and an I/O circuit 270.

The memory cell array (of bank arrays) 240A~240D may include first through fourth bank arrays 240A~240D, respectively, in which a plurality of memory cells are arranged in rows and columns. A row decoder and a column decoder for selecting word-lines and bit-lines that are connected to the memory cells may be connected to each of the first through fourth bank arrays 240A~240D. In an exemplary embodiment of the inventive concept, the semiconductor memory device 200a includes the four bank arrays 240A~240D. However, the semiconductor memory device 200a may include an arbitrary (e.g., a different or varying) number of bank arrays.

The command/address input buffer 210 may receive the clock signal CLK, the command CMD, and the address ADDR from the memory controller 100. The command CMD and the address ADDR may be input via the same terminals, e.g., CA pads. The command CMD and the address ADDR may be sequentially input via the CA pads. The command CMD issued by the memory controller 100 may include the read command and the write command. The read command indicates a read operation to be performed on the semiconductor memory device 200a. The write command indicates a write operation to be performed on the semiconductor memory device 200a.

The command/address input buffer 210 may sample the command CMD and address ADDR based on the clock signal CLK and may provide the sampled command and sampled address to the control logic circuit 220.

The control logic circuit 220 may receive the sampled command CMD and the address ADDR from the command/address input buffer 210, and may generate an internal command ICMD and an address signal (BA/RA/CA). The internal command ICMD may include an internal read command and an internal write command. The address signal may include a bank address BA, a row address RA, and a column address CA. The internal command ICMD and the address signal BA/RA/CA may be provided to each bank control logic 230A~230D. The control logic circuit 220 may control access to the memory cell array (of bank arrays) 240A~240D.

The control logic circuit 220 may include a command decoder 221 and a mode register 222. The command decoder 221 decodes the command CMD to generate the internal command ICMD. The mode register 222 may set an operation mode of the semiconductor memory device 200a based on the command CMD and the address ADDR.

For example, the mode register 222 may set a write latency in the write operation of the semiconductor memory device 200a and a read latency in the read operation of the semiconductor memory device 200a. The write and read latencies may be set based on the command CMD and the address ADDR, according to a frequency of the clock signal CLK.

In addition, the control logic circuit 220 decodes the command CMD to generate control signal CTL and provides the control signal CTL to the I/O data buffer 300.

Each bank control logic 230A~230D may be activated by a corresponding bank address BA. The activated bank control logic 230A~230D may generate bank control signals in response to the internal command ICMD, the row address RA, and the column address CA. In response to a bank control signal, the row decoder and the column decoder of each of the first through fourth bank arrays 240A~240D that are connected to the activated bank control logic 230A~230D may be activated.

The row decoder of each of the first through fourth bank arrays 240A~240D may decode the row address RA, and therefore, may enable a word-line that corresponds to the row address RA. The column address CA of each of the first through fourth bank arrays 240A~240D may be temporarily stored in a column address latch. The column address latch may stepwise increase the column address CA in a burst mode. The temporarily stored or stepwise increased column address CA may be provided to the column decoder. The column decoder may decode the column address CA, and therefore, may activate a column selection signal CSL that corresponds to the column address CA.

In response to its bank control signal, each bank control logic 230A~230D may generate an ECC encoding signal ENC and an ECC decoding signal DEC for controlling operations of the ECC engines 260A~260D that are connected to the first through fourth bank arrays 240A~240D, respectively.

The write driver and data I/O sense amplifiers 250A~250D may sense and amplify read data DTA output from the first through fourth bank arrays 240A~240D, respectively. The write driver and data I/O sense amplifiers 250A~250D may transmit write data DTA to be stored in the first through fourth bank arrays 240A~240D, respectively.

During the write operation, each of the ECC engines 260A~260D may generate parity bits by performing an ECC encoding operation on the write data DTA to be stored in each of the first through fourth bank arrays 240A~240D, in response to the ECC encoding signal ENC output from each bank control logic 230A~230D.

During the read operation, each of the ECC engines 260A~260D may perform an ECC decoding operation in response to the ECC decoding signal DEC output from each of the first through fourth bank arrays 240A~240D. The ECC engines 260A~260D may perform the ECC decoding operation by using the read data DTA and parity bits that are read from each of the first through fourth bank arrays 240A~240D. Therefore, the ECC engines 260A~260D may detect and correct error bits in pieces of the read data DTA.

The I/O data buffer 300 may include circuits for gating the data DTA that are input to or output from the first through fourth bank arrays 240A~240D; read data latches for storing the data DTA output from the first through fourth bank arrays 240A~240D; and write data latches for writing the data DTA to the first through fourth bank arrays 240A~240D.

The I/O data buffer 300 may convert parallel data bits that are output from the first through fourth bank arrays 240A~240D into serial data bits via the read data latches. The I/O data buffer 300 may convert write data that are serially received into parallel data bits by using the write data latches.

During the write operation, the I/O data buffer 300 may divide the clock signal CLK, may generate an alignment control signal by sampling the divided clock signal according to the data strobe signal DQS, may align serial data DQ in parallel using the alignment control signal, and may generate the internal data DTA. The serial data DQ may be serially input.

The I/O circuit 270 may receive the serial data bits output from the I/O data buffer 300, may sequentially arrange the serial data bits as data bits that correspond to a burst length, and then, may output the data bits and the data strobe signal DQS to data I/O pads. The data bits and the data strobe signal DQS may be output together. The I/O circuit 270 may receive the data strobe signal DQS and pieces of write data DTA that correspond to the burst length. The pieces of the write data DTA may be serially input via the data I/O pads from the memory controller 100. The I/O circuit 270 may provide, to the I/O data buffer 300, the pieces of serially input write data DTA that correspond to the burst length.

During the write operation, the I/O circuit 270 may receive the clock signal CLK, the serial data DQ and the data strobe signal DQS from the memory controller 100 and may provide, to the I/O data buffer 300, the clock signal CLK, the serial data DQ and the data strobe signal DQS.

Figure 4:
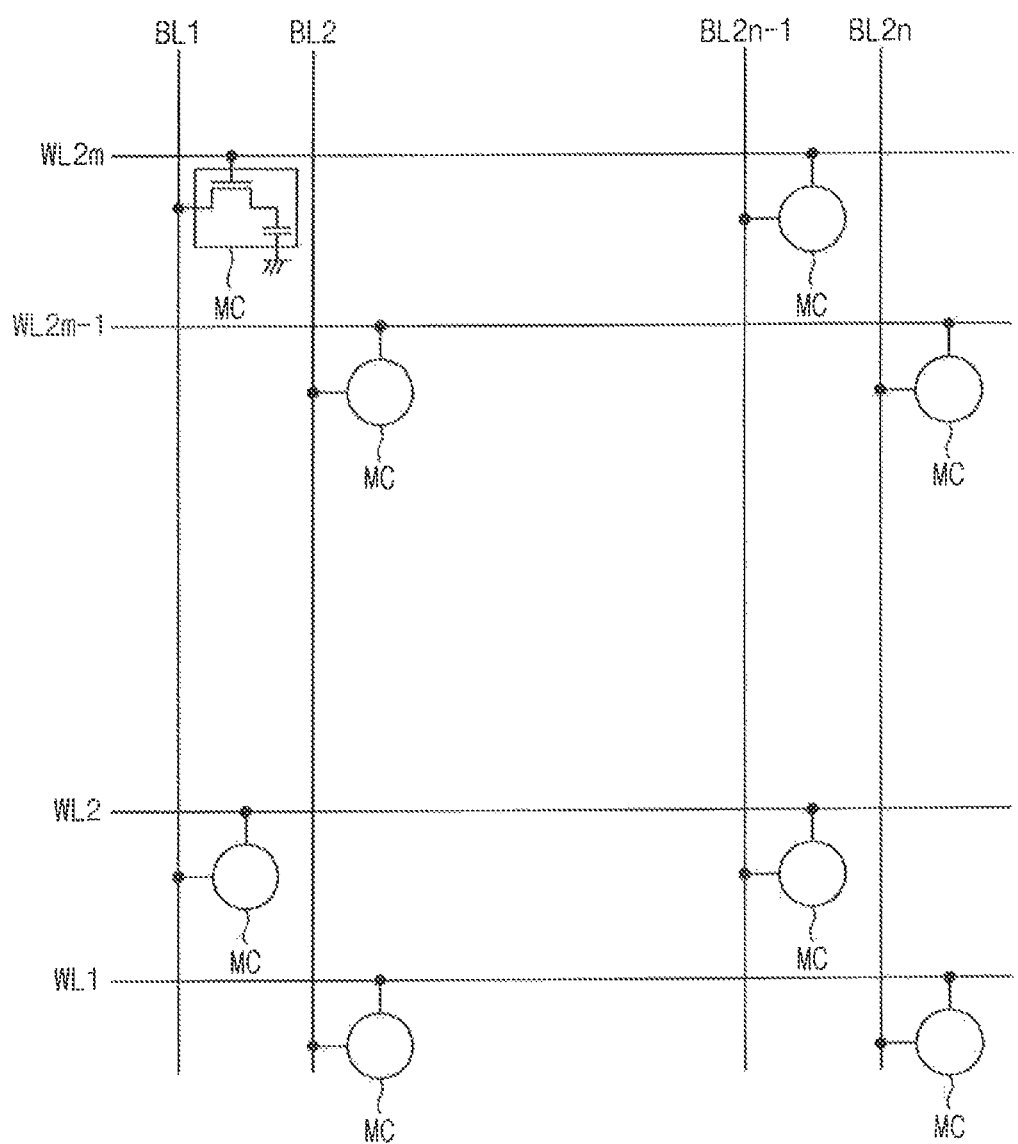
FIG. 4 illustrates a first bank array in the semiconductor memory device of FIG. 3 according to an exemplary embodiment of the inventive concept.

FIG. 4 illustrates the first bank array in the semiconductor memory device of FIG. 3 according to an exemplary embodiment of the inventive concept.

Referring to FIG. 4, the first bank array 240A includes a plurality of word-lines WL1~WL2$m$ (m is a natural number greater than two), a plurality of bit-lines BL1~BL2$n$ (n is a natural number greater than two), and a plurality of memory cells MCs disposed near intersections between the word-lines WL1~WL2$m$ and the bit-lines BL1~BL2$n$. In an exemplary embodiment of the inventive concept, each of the memory cells MCs may include a DRAM cell structure. The word-lines WL1~WL2m to which the memory cells MCs are connected may be rows of the first bank array 240A and the bit-lines BL1~BL2n to which the memory cells MCs are connected may be columns of the first bank array 240A.

In FIG. 4, m memory cells are coupled to a bit-line BL of the first bank array 240A and m memory cells are coupled to a word-line (e.g., WL2m) of the first bank array 240A.

Figure 5:
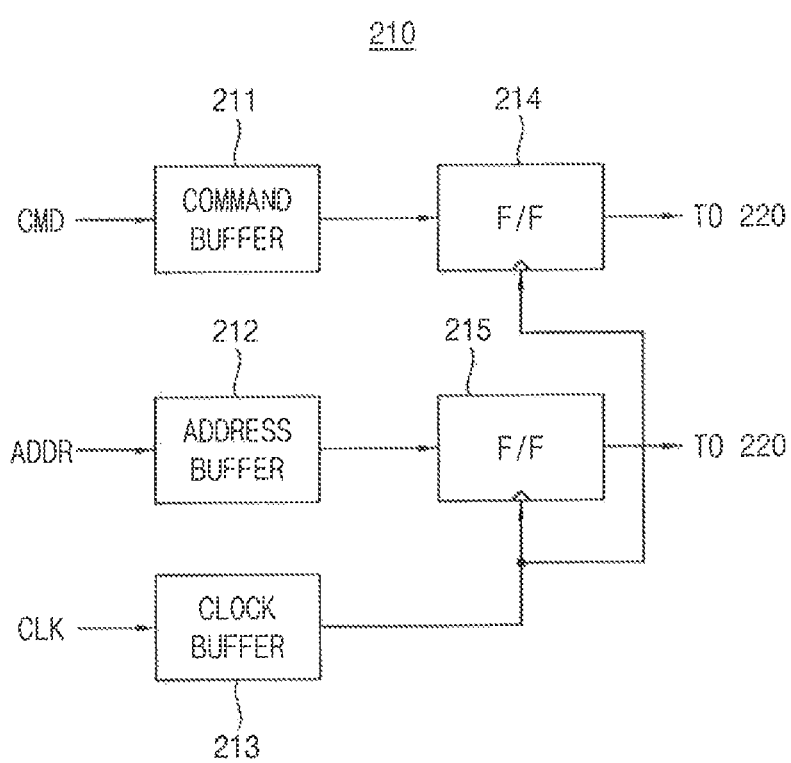
FIG. 5 illustrates a command/address buffer in the semiconductor memory device of FIG. 3 according to an exemplary embodiment of the inventive concept.

FIG. 5 illustrates the command/address input buffer in the semiconductor memory device of FIG. 3 according to an exemplary embodiment of the inventive concept.

Referring to FIG. 5, the command/address input buffer 210 may include a command buffer 211, an address buffer 212, a clock buffer 213 and samplers 214 and 215.

The command buffer 211 buffers the command CMD to provide a buffered command to the sampler 214. The address buffer 212 buffers the address ADDR to provide a buffered address to the sampler 215. The clock buffer 213 buffers the clock signal CLK to provide a buffered clock signal CLK to the samplers 214 and 215. The sampler 214 samples the command CMD in synchronization with the clock signal CLK to provide the sampled command to the control logic circuit 220. The sampler 214 samples the address ADDR in synchronization with the clock signal CLK to provide the sampled address to the control logic circuit 220. The samplers 214 and 215 may include a flip-flop.

Figure 6:
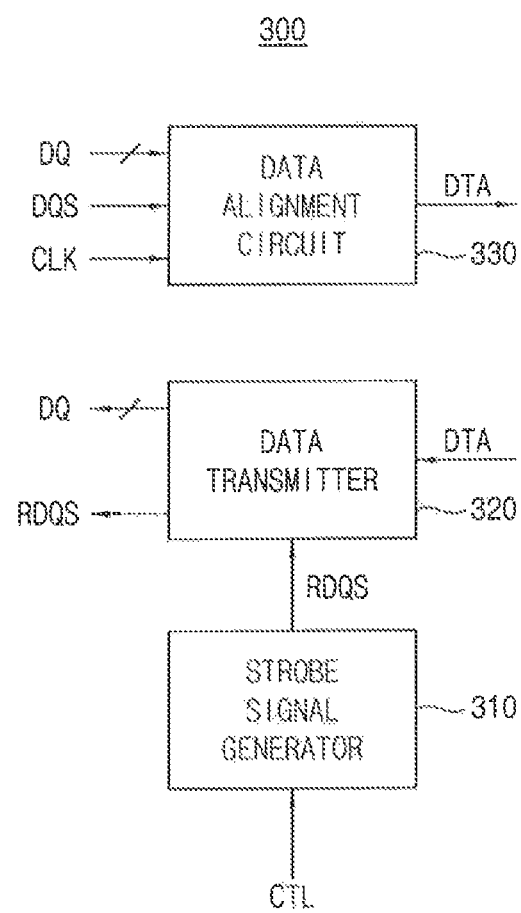
FIG. 6 illustrates an input/output (I/O) data buffer in the semiconductor memory device of FIG. 3 according to an exemplary embodiment of the inventive concept.

FIG. 6 illustrates the I/O data buffer in the semiconductor memory device of FIG. 3 according to an exemplary embodiment of the inventive concept.

Referring to FIG. 6, the I/O data buffer 300 may include a data alignment circuit 330, a data transmitter 320 and a strobe signal generator 310.

The strobe signal generator 310 may generate a read strobe signal RDQS in response to the control signal CTL from the control logic circuit 220 and may provide the read strobe signal RDQS to the data transmitter 320.

The data transmitter 320 may convert the internal data DTA received in parallel from the memory cell array 240A~240D to the serial data (e.g., signal) DQ, and may transmit the serial data DQ to the memory controller 100 in synchronization with the read strobe signal RDQS. In an exemplary embodiment of the inventive concept, the data transmitter 320 may transmit the serial data DQ along with the read strobe signal RDQS to the memory controller 100.

The data alignment circuit 330 may receive the serial data DQ, the data strobe signal DQS and the clock signal CLK, may divide the clock signal CLK, may generate the alignment control signal by sampling the divided clock signal according to the data strobe signal DQS, may align the serial data DQ in parallel using the alignment control signal, and may generate the internal data DTA. The serial data DQ may be serially input to the data alignment circuit 300. The data alignment circuit 330 may provide the internal data DTA to the memory cell array 240A~240D.

Figure 7:
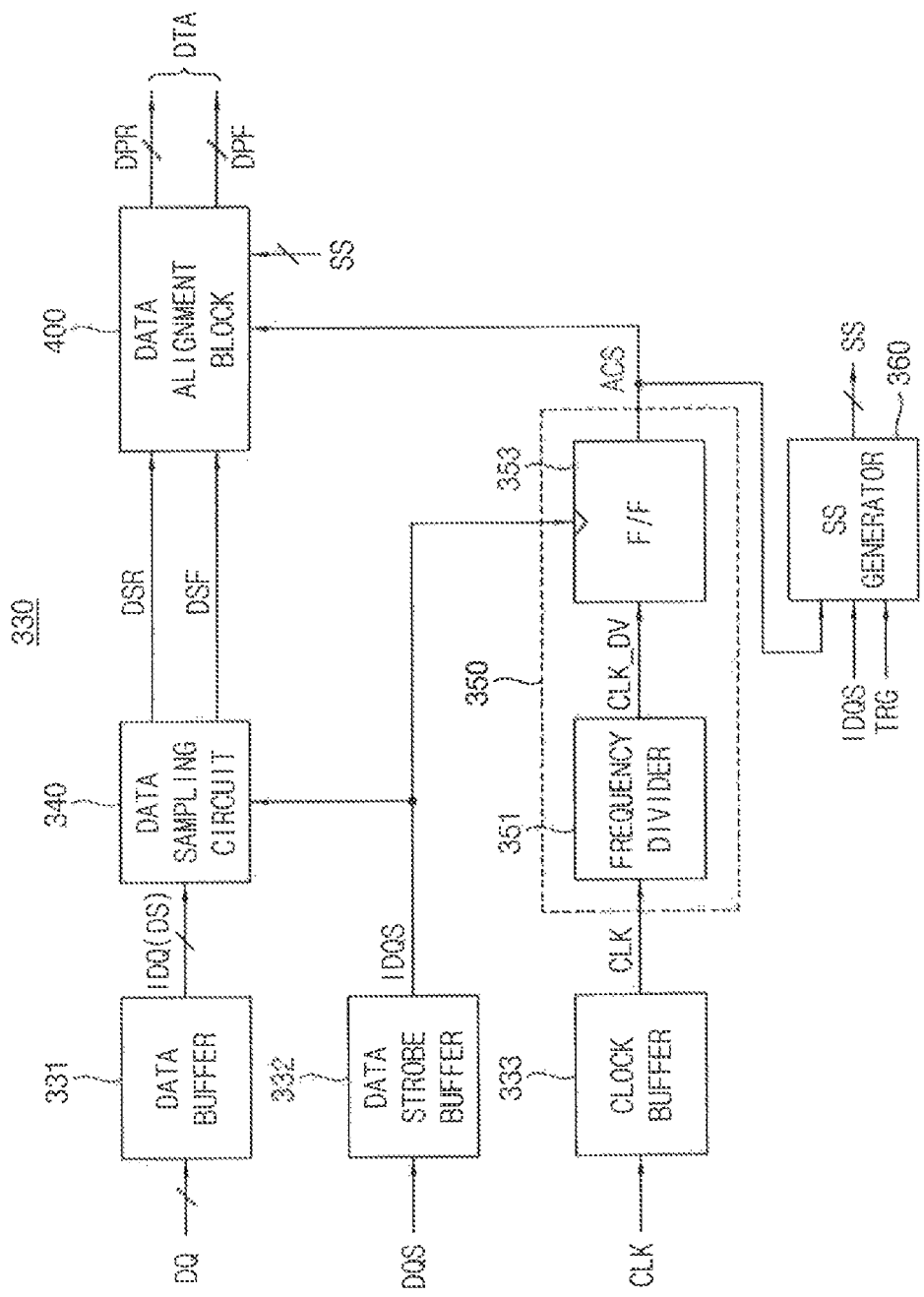
FIG. 7 is a block diagram illustrating a data alignment circuit in the I/O data buffer in FIG. 6 according to an exemplary embodiment of the inventive concept.

FIG. 7 is a block diagram illustrating the data alignment circuit in the I/O data buffer of FIG. 6 according to an exemplary embodiment of the inventive concept.

Figure 8:
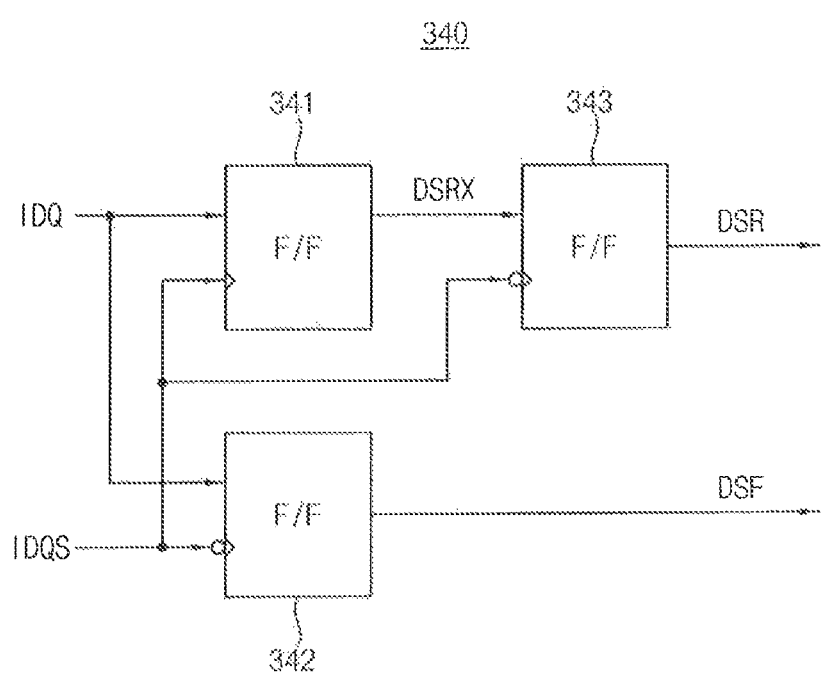
FIG. 8 is a block diagram illustrating a data sampling circuit in the I/O data buffer in FIG. 6 according to an exemplary embodiment of the inventive concept.

FIG. 8 is a block diagram illustrating a data sampling circuit in the I/O data buffer of FIG. 6 according to an exemplary embodiment of the inventive concept.

Figure 9:
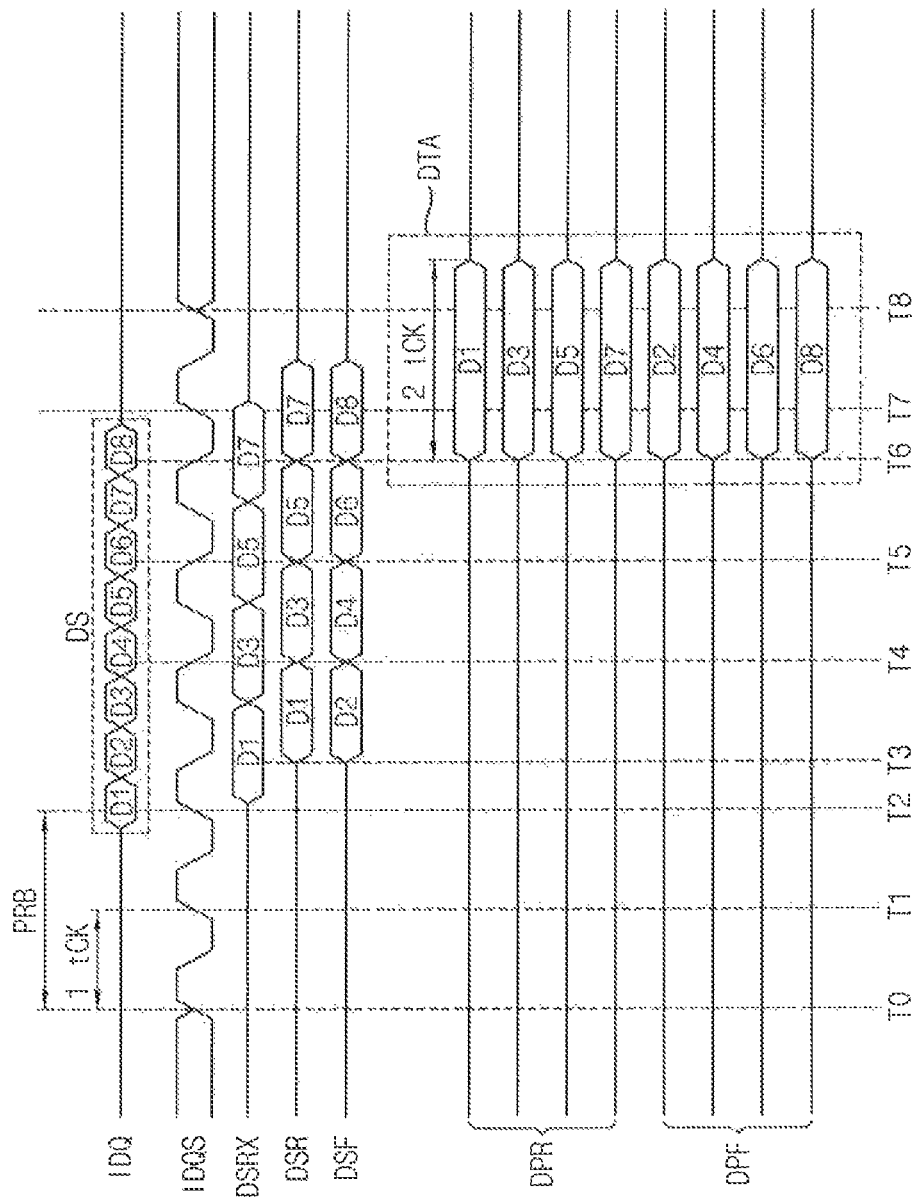
FIG. 9 is a timing diagram illustrating internal signals of the data alignment circuit of FIG. 7 according to an exemplary embodiment of the inventive concept.

FIG. 9 is a timing diagram illustrating internal signals of the data alignment circuit of FIG. 7 according to an exemplary embodiment of the inventive concept.

Referring to FIGS. 7 and 9, the data alignment circuit 330 may receive the data signal DQ, the data strobe signal DQS and the clock signal CLK. The data alignment circuit 330 may receive the data signal DQ including a data sequence DS that includes a series of N (N is a natural number greater than tow) blocks of data synchronized with data strobe signal DQS and may output N internal data DTA aligned in parallel with data sequence DS.

The data alignment circuit 330 may support a DDR mode. Thus, a data sequence DS received by the data alignment circuit 330 may include data synchronized with rising and falling edges of a data strobe signal DQS. In operation, the data alignment circuit 330 may respond to each of the rising and falling edges of the data strobe signal DQS, sample the data signal DQ, and thus, receive the data sequence DS.

In an exemplary embodiment of the inventive concept, the data alignment circuit 330 may operate in a burst mode. The burst mode is an operation mode that includes, first, transmitting a signal that notifies a device that the burst mode has started, and then, serially transmitting or receiving a predetermined number (referred to as "burst length") of data blocks. The semiconductor memory device 200a may receive write commands that correspond to a burst write mode from the memory controller 100, and then, serially receive the data that corresponds to the burst length. A series of data that is serially received may be referred to as a data sequence. FIG. 9 illustrates a case of the data alignment circuit 330 that outputs 8 internal data DTA that are aligned in parallel when the burst length is 8, e.g., when N equals 8.

Referring to FIG. 7, the data alignment circuit 330 includes a data buffer 331, a data strobe buffer 332, a clock buffer 333, a data sampling circuit 340, a division circuit 350, a selection signal generator 360 and a data alignment block 400.

The data buffer 331 may buffer the received data signal DQ and may output an internal data signal IDQ. The data strobe buffer 332 may buffer the received data strobe signal DQS and may output an internal data strobe signal IDQS. The clock buffer 333 may buffer the received clock signal CLK and may output the clock signal CLK. Hereinafter, there will be a description based on the internal data signal IDQ and the internal data strobe signal IDQS which are generated from the data signal DQ and data strobe signal DQS through the data buffer 331 and the data strobe buffer 332, respectively.

The data strobe signal DQS may have a predetermined cycle before the data sequence DS is received based on the data signal DQ. For example, as illustrated in FIG. 9, the internal data strobe signal IDQS may be received for 2 cycles before the data sequence DS. For example, from time point T0 to time point T2. The number of times that data strobe signal DQS oscillates before being received along with the data sequence DS may be referred to as the preamble. The number of times the data strobe signal DQS oscillates may correspond to the number of cycles of the data strobe signal DQS. The preamble may be predetermined among devices that transmit and receive data, and may be changed by transmitting and receiving setting signals. In FIG. 9, the preamble is shown as 2 tCK, where 1 tCK indicates 1 clock cycle time.

The data sampling circuit 340 may receive the data sequence DS from the data buffer 331, and may receive the internal data strobe signal IDQS from the data strobe buffer 332. The data sampling circuit 340 may use the internal data strobe signal IDQS to sample the data sequence DS based on the internal data signal IDQ. For example, the data sampling circuit 340 may sample the data sequence DS at each of the rising and falling edges of internal data strobe signal IDQS, and thereby generate two data sequences DSR and DSF.

The data sampling circuit 340 may output a first data sequence DSR that includes odd bits of the data sequence DS, and a second data sequence DSF that includes even bits of the data sequence DS. For example, the first data sequence DSR may include data bits sampled from the data sequence DS at a rising edge of the internal data strobe signal IDQS and the second data sequence DSR may include data bits sampled from the data sequence DS at a falling edge of the internal data strobe signal IDQS. Therefore, as illustrated in FIG. 9, because one data sequence DS is processed into two parallel data sequences DSR and DSF, durations of data included in the data sequence DS may be ½ tCK, and durations of data included in the data sequences DSR or DSF may be 1 tCK (e.g., one clock cycle).

The division circuit 350 may receive the clock signal CLK and the internal data strobe signal IDQS, may divide the clock signal CLK and may output an alignment control signal ACS by sampling the divided clock signal based on the internal data strobe signal IDQS.

The division circuit 350 may include a frequency divider 351 and a sampler 353. The frequency divider 351 may divide a frequency of the clock signal CLK to output a divided clock signal CLK_DV. The frequency divider 351 may divide the frequency of the clock signal CLK by a predetermined number greater than one, e.g., 2. The sampler 353 may sample the divided clock signal CLK_DV based on the internal data strobe signal IDQS to output the alignment control signal ACS. The sampler 353 may sample the divided clock signal CLK_DV at a rising edge of the internal data strobe signal IDQS. The division circuit 350 may include the frequency divider 351 when a frequency of the clock signal CLK is substantially the same as a frequency of the internal data strobe signal IDQS. In an exemplary embodiment, the division circuit 350 may not include the frequency divider 351 when the frequency of the clock signal CLK is smaller the frequency of the internal data strobe signal IDQS. In addition, although not illustrated, the division circuit 350 may output the alignment control signal ACS after delaying an output of the sampler 353. Therefore, the alignment control signal ACS may not be synchronized with an edge of the first data sequence DSR or the second data sequence DSF.

Instead of directly dividing the internal data strobe signal IDQS, the division circuit 350 divides the clock signal CLK which toggles stably, samples the divided clock signal CLK_DV according to the internal data strobe signal IDQS, and generates the alignment control signal ACS. Therefore, the division circuit 350 (or, the data alignment circuit 330) may prevent the alignment control signal ACS from entering into a meta-stable state which may occur when the division circuit 350 divides the internal data strobe signal IDQS.

The selection signal generator 360 may receive the internal data strobe signal IDQS, a trigger signal TRG, and the alignment control signal ACS and may determine a logic level of the alignment control signal ACS at an edge of the internal data strobe signal IDQS. The selection signal generator 360 may output a selection signal SS having a logic level which is based on a logic level of the alignment control signal ACS at the edge of the internal data strobe signal IDQS. As will be described later, the selection signal SS includes a first selection signal SS1 and a second selection signal SS2.

The alignment control signal ACS may have a different logic level at a rising edge of the internal data strobe signal IDQS. The alignment control signal ACS may have a high level or a low level at a time point when a first data of the data sequence DS is received. The alignment control signal ACS has a different logic level depending on a length of the preamble PRB.

As described above, the internal data strobe signal IDQS may be received earlier than the data sequence DS. For example, the internal data strobe signal IDQS may be received for a time corresponding to the length of the preamble (e.g., any number of tCKs) before the data sequence DS is received. In addition, the length of the preamble may vary according to a predetermined value. Accordingly, the logic level of the alignment control signal ACS may depend on whether the number of cycles of the internal data strobe signal IDQS, which corresponds to the length of the preamble, is odd or even. In regards to a write command CMD, the logic level of the alignment control signal ACS may depend on whether the number of cycles of the internal data strobe signal IDQS between consecutive write commands is odd or even. For example, when the number of cycles of the internal data strobe signal IDQS is odd, the logic level of the alignment control signal ACS may be inverted. For example, when the number of cycles of the internal data strobe signal IDQS is even, the logic level of the alignment control signal ACS may be maintained.

The selection signal generator 360 may receive the trigger signal TRG that prearranges input of the data sequence DS. The trigger signal TRG provides advance notification that the data sequence DS, including the series of data, will be input. The trigger signal TRG may be generated, for example, from signals that are generated by decoding the write commands received from the memory controller 100. To write data in the burst write mode, the memory controller 100 may transmit the write commands, which indicate the burst write mode, to the semiconductor memory device 200a. The command decoder 221 in FIG. 3 may generate the trigger signal TRG that indicates reception of the write commands, by decoding the write commands.

The data alignment block 400 may receive the first and second data sequences DSR and DSF from the data sampling circuit 340, the alignment control signal ACS and the selection signal SS. The data alignment block 400 may align the first and second data sequences DSR and DSF in parallel to output the internal data DTA aligned in N number of rows.

Referring to FIG. 8, the data sampling circuit 340 may include first through third samplers 341, 342 and 343. The first sampler 341 may be a falling edge-triggered flip-flop and each of the second and third samplers 342 and 343 may be a rising edge-triggered flip-flop.

The first sampler 341 may receive the internal data signal IDQ and may be controlled by the internal data strobe signal IDQS. The first sampler 341 may sample the internal data signal IDQ at a rising edge of the internal data strobe signal IDQS. The second sampler 342 may receive the internal data signal IDQ, may be controlled by the internal data strobe signal IDQS and may sample the internal data signal IDQ at a falling edge of the internal data strobe signal IDQS.

To synchronize a data sequence DSRX output from the first sampler 341 and the data sequence DSF output from the second sampler 342, the third sampler 343 may sample the data sequence DSRX output from the first sampler 341 at a falling edge of the internal data strobe signal IDQS. Accordingly, the durations of the data in the data sequences DSR or DSF output from the data sampling circuit 340 may be twice as long as the duration of the data in the data sequence DS received by the data sampling circuit 340. FIG. 9 illustrates the internal data strobe signal IDQS and the data sequences DS, DSRX, DSR and DSF which are related to the data sampling circuit 340.

As illustrated in FIG. 9, the data alignment block 400 receives the first data sequence DSR and the second data sequence DSF, aligns the first data sequence DSR in parallel using the alignment control signal ACS and the selection signal SS, and outputs first parallel data DPR that includes 4 data bits D1, D3, D5, and D7. In addition, the data alignment block 400 aligns the second data sequence DSF in parallel using the alignment control signal ACS and the selection signal SS, and outputs second parallel data DPF that includes 4 data bits D2, D4, D6, and D8. A duration of the internal data DTA including the first parallel data DPR and the second parallel data DPF may be 2 tCK (e.g., two clock cycles).

A time interval between time points T0 and T2 may correspond to a preamble PRB, and bits of the data sequence DS may be sampled from the time point T2. Each bit of the first data sequence DSR and the second data sequence DSF may be sampled according to the alignment control signal ACS from time point T3 to time point T7, and bits of the internal data DTA may be output in parallel from time point T6. The internal data strobe signal IDQS toggles from time point T0 to time point T8.

Figure 10:
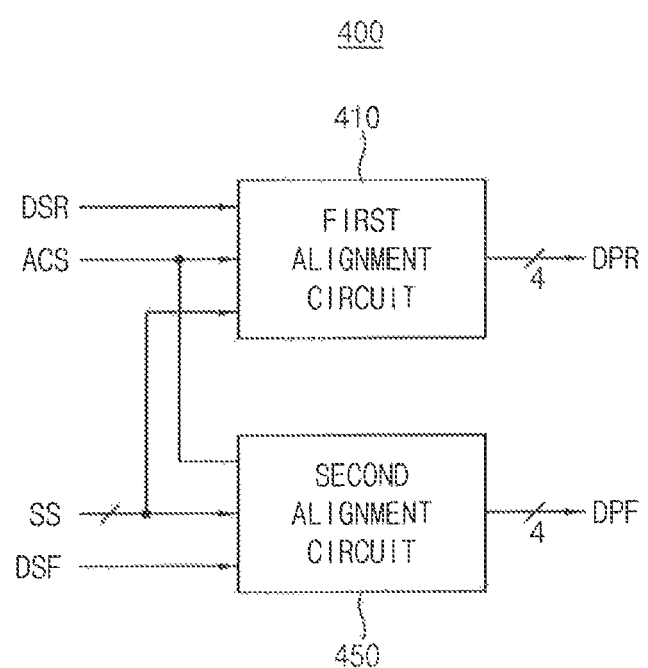
FIG. 10 is a block diagram illustrating a data alignment block in the data alignment circuit of FIG. 7 according to an exemplary embodiment of the inventive concept.

FIG. 10 is a block diagram illustrating the data alignment block in the data alignment circuit of FIG. 7 according to an exemplary embodiment of the inventive concept.

Referring to FIG. 10, the data alignment block 400 may include a first alignment circuit 410 and a second alignment circuit 450.

The first alignment circuit 410 receives the first data sequence DSR, the alignment control signal ACS and the selection signal SS. The first alignment circuit 410 aligns the first data sequence DSR in parallel in response to the alignment control signal ACS and the selection signal SS and outputs the first parallel data DPR. The first parallel data DPR may include 4 bits. The second alignment circuit 450 receives the second data sequence DSF, the alignment control signal ACS and the selection signal SS. The second alignment circuit 450 aligns the second data sequence DSF in parallel in response to the alignment control signal ACS and the selection signal SS and outputs the second parallel data DPF. The second parallel data DPF may include 4 bits.

Figure 11:
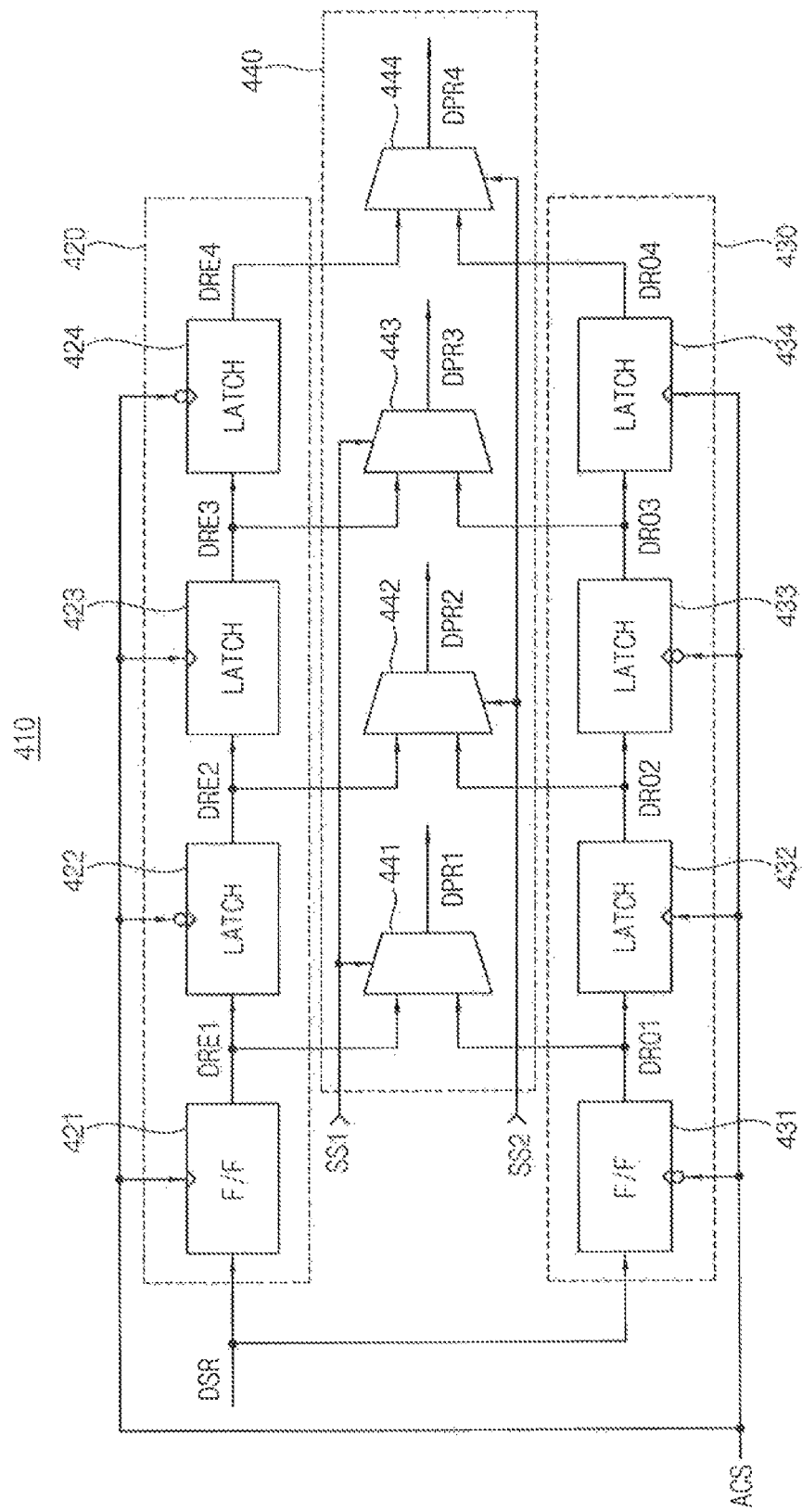
FIG. 11 is a circuit diagram illustrating a first alignment circuit in the data alignment block of FIG. 10 according to an exemplary embodiment of the inventive concept.

FIG. 11 is a circuit diagram illustrating the first alignment circuit in the data alignment block of FIG. 10 according to an exemplary embodiment of the inventive concept.

Referring to FIG. 11, the first alignment circuit 410 may include a first alignment block 420, a second alignment block 430 and a selection block 440. The first alignment block 420 is controlled by the alignment control signal ACS. The first alignment block 420 aligns bits of the first data sequence DSR and outputs first parallel bits DRE1, DRE2, DRE3 and DRE4.

The first alignment block 420 may include a rising edge-triggered flip-flop 421 and first latches 422, 423 and 424 which are connected in series. The first parallel bits DRE1, DRE2, DRE3 and DRE4 provided from the rising edge-triggered flip-flop 421 and the first latches 422, 423 and 424 may be provided to the selection block 440. The latches 422 and 424 may be a falling edge-triggered type and the latch 423 may be a rising edge-triggered type.

The second alignment block 430 is controlled by the alignment control signal ACS. The second alignment block 430 aligns bits of the first data sequence DSR and outputs second parallel bits DRO1, DRO2, DRO3 and DRO4.

The second alignment block 430 may include a falling edge-triggered flip-flop 431 and second latches 432, 433 and 434 which are connected in series. The second parallel bits DRO1, DRO2, DRO3 and DRO4 provided from the falling edge-triggered flip-flop 431 and the second latches 432, 433 and 434 may be provided to the selection block 440. The latches 432 and 434 may be a rising edge-triggered type and the latch 433 may be a falling edge-triggered type.

The selection block 440 may include a plurality multiplexers 441, 442, 443 and 444. Each of the plurality multiplexers 441, 442, 443 and 444 may select one of corresponding bits of the first parallel bits DRE1, DRE2, DRE3 and DRE4 and the second parallel bits DRO1, DRO2, DRO3 and DRO4 in response to the first selection signal SS1 and the second selection signal SS2 and may output each selected bit as the first parallel data DPR1, DPR2, DPR3 and DPR4. The first selection signal SS1 is applied to the multiplexers 441 and 443 and the second selection signal SS2 is applied to the multiplexers 442 and 444. The first selection signal SS1 and the second selection signal SS2 may be included in the selection signal SS and may have different logic levels with respect to each other.

Figure 12:
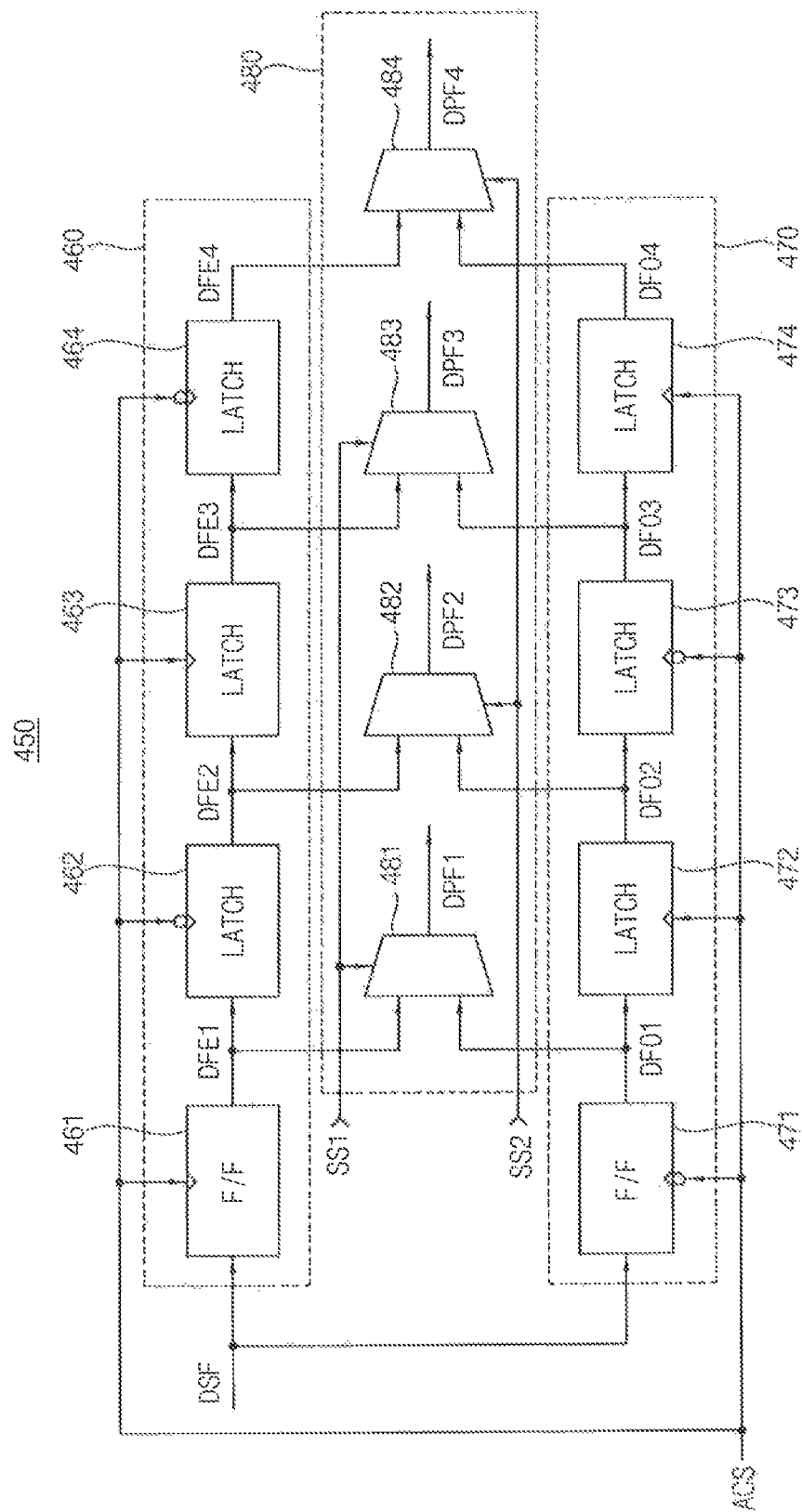
FIG. 12 is a circuit diagram illustrating a second alignment circuit in the data alignment block of FIG. 10 according to an exemplary embodiment of the inventive concept.

FIG. 12 is a circuit diagram illustrating the second alignment circuit in the data alignment block of FIG. 10 according to an exemplary embodiment of the inventive concept.

Referring to FIG. 12, the second alignment circuit 450 may include a first alignment block 460, a second alignment block 470 and a selection block 480.

The first alignment block 460 is controlled by the alignment control signal ACS. The first alignment block 460 aligns bits of the second data sequence DSF and outputs first parallel bits DFE1, DFE2, DFE3 and DFE4. The first alignment block 460 may include a rising edge-triggered flip-flop 461 and first latches 462, 463 and 464 which are connected in series. The first parallel bits DFE1, DFE2, DFE3 and DFE4 provided from the rising edge-triggered flip-flop 461 and the first latches 462, 463 and 464 may be provided to the selection block 480. The latches 462 and 464 may be a falling edge-triggered type and the latch 463 may be a rising edge-triggered type.

The second alignment block 470 is controlled by the alignment control signal ACS. The second alignment block 470 aligns bits of the second data sequence DSF and outputs second parallel bits DFO1, DFO2, DFO3 and DFO4.

The second alignment block 470 may include a falling edge-triggered flip-flop 471 and second latches 472, 473 and 474 which are connected in series. The second parallel bits DFO1, DFO2, DFO3 and DFO4 may be provided from the falling edge-triggered flip-flop 471 and the second latches 472, 473 and 474 may be provided to the selection block 480. The latches 472 and 474 may be a rising edge-triggered type and the latch 473 may be a falling edge-triggered type.

The selection block 480 may include a plurality of multiplexers 481, 482, 483 and 484. Each of the plurality multiplexers 481, 482, 483 and 484 may select one of corresponding bits of the first parallel bits DFE1, DFE2, DFE3 and DFE4 and the second parallel bits DFO1, DFO2, DFO3 and DFO4 in response to the first selection signal SS1 and the second selection signal SS2 and may output each selected bit as the second parallel data DPF1, DPF2, DPF3 and DPF4. The first selection signal SS1 is applied to the multiplexers 481 and 483 and the second selection signal SS2 is applied to the multiplexers 482 and 484.

Figure 13:
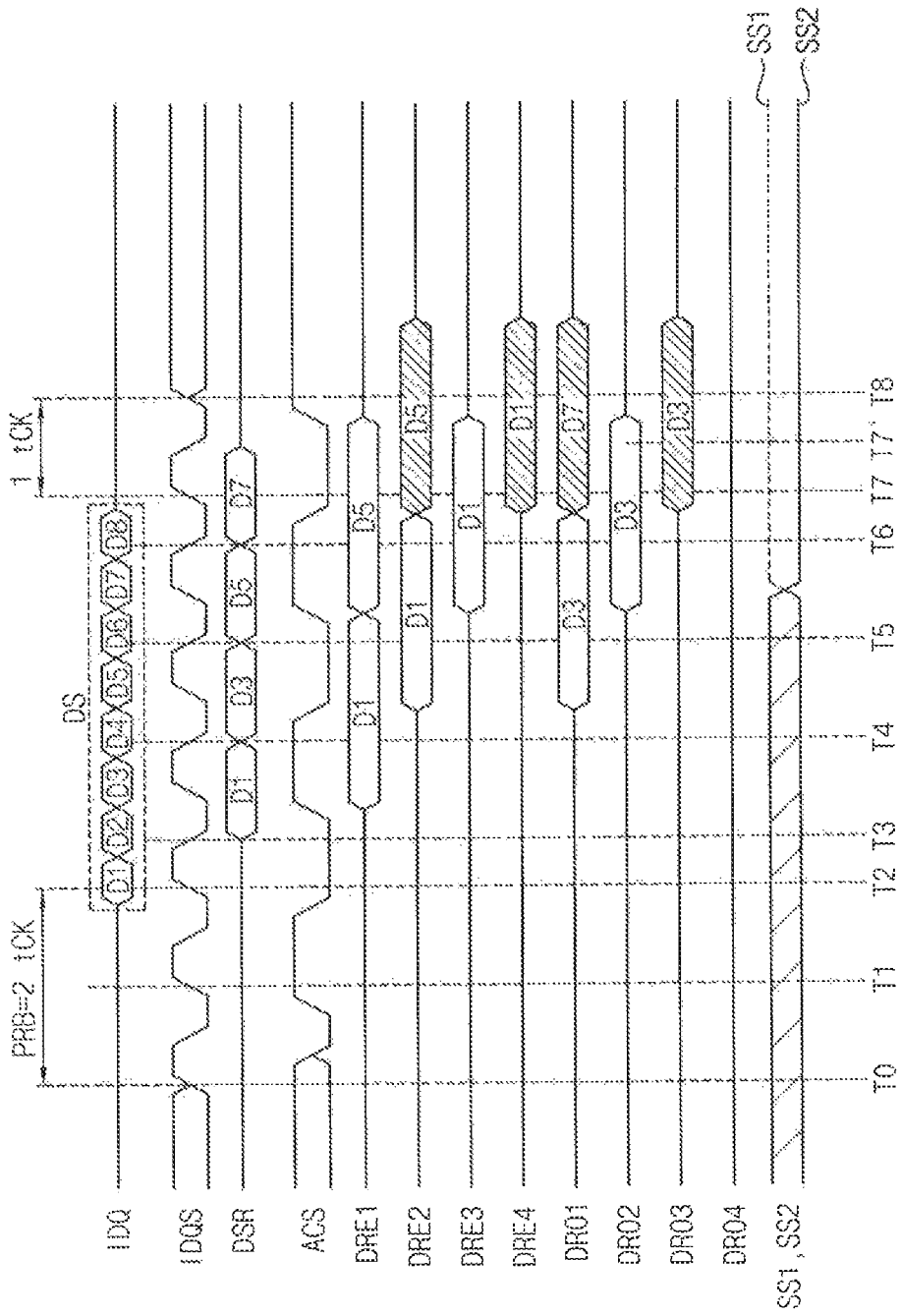
FIG. 13 is a timing diagram illustrating an operation of the first alignment circuit of FIG. 11 according to an exemplary embodiment of the inventive concept.

FIG. 13 is a timing diagram illustrating an operation of the first alignment circuit of FIG. 11 according to an exemplary embodiment of the inventive concept.

In FIG. 13, it is assumed that the alignment control signal ACS has a low level at a rising edge of the internal data strobe signal IDQS at time point T2 when the data sampling circuit 340 samples a first bit D1 of the data sequence DS.

Referring to FIGS. 11 and 13, the first alignment block 420 receives the first bit D1 of the first data sequence DSR at time point T3. The rising edge-triggered flip-flop 421 samples the first bit D1 in response to a rising edge of the alignment control signal ACS at a time point after time point T3 and maintains the first bit D1 until a time point after time point T5, when the next rising edge of the alignment control signal ACS occurs. The latch 422 connected to the rising edge triggered flip-flop 421 responds to a low level of the alignment control signal ACS between time points T4 and T6, and thus, latches and outputs the first bit D1 output from the rising edge triggered flip-flop 421. The latch 423 connected to the latch 422 responds to a high level of the alignment control signal ACS between time points T5 and T7, and thus, latches and outputs the first bit D1 output from the latch 422. The latch 424 connected to the latch 423 responds to a low level of the alignment control signal ACS between time points T6 and T8, and thus, latches and outputs the first bit D1 output from the latch 423.

In addition, the second alignment block 430 receives a second bit D3 of the first data sequence DSR at a time point after time point T4. The falling edge-triggered flip-flop 431 samples the bit D3 in response to a falling edge of the alignment control signal ACS at a time point after time point T4 and maintains the bit D3 until a time point after time point T6, when the next falling edge of the alignment control signal ACS occurs. The latch 432 connected to the falling edge triggered flip-flop 432 responds to a high level of the alignment control signal ACS between time points T5 and T7', and thus, latches and outputs the bit D3 output from the falling edge triggered flip-flop 431.

The latch 433 connected to the latch 432 responds to a low level of the alignment control signal ACS between time points T6 and T8, and thus, latches and outputs the bit D3 output from the latch 432. As illustrated in FIG. 13, bits DRE2 and DRE4, which are output from the selection block 440 in response to the second selection signal SS2 from time point T6, respectively represent bits D5 and D1 and bits DRO1 and DRO3, which are output from the selection block 440 in response to the first selection signal SS1 from time point T6, respectively represent bits D7 and D3. Therefore, the 4 data bits D1, D3, D5 and D7 in the first data sequence DSR are aligned in parallel from a time point after time point T6, and respective durations of the 4 data bits D1, D3, D5, and D7 may be 2 tCK.

Figure 14:
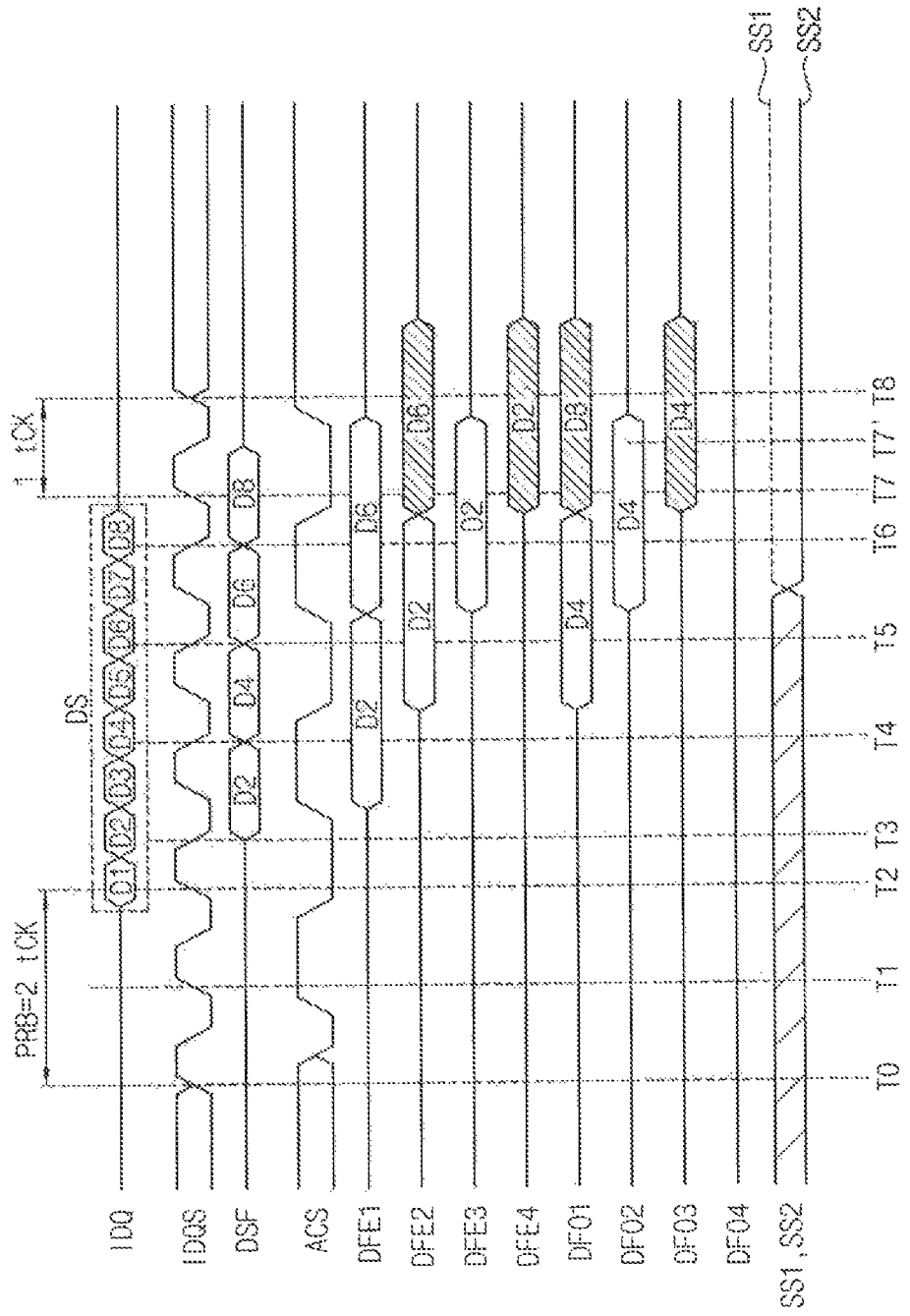
FIG. 14 is a timing diagram illustrating an operation of the second alignment circuit of FIG. 12 according to an exemplary embodiment of the inventive concept.

FIG. 14 is a timing diagram illustrating an operation of the second alignment circuit of FIG. 12 according to an exemplary embodiment of the inventive concept.

In FIG. 14, it is assumed that the alignment control signal ACS has a low level at a rising edge of the internal data strobe signal IDQS at time point T2 when the data sampling circuit 340 samples a first bit D1 of the data sequence DS.

The operation of the second alignment circuit 450 is substantially similar to the operation of the first alignment circuit 410 described with reference to FIG. 13. Therefore, descriptions for operations of the first alignment block 460 (which corresponds to the first alignment block 420), the second alignment block 470 (which corresponds to the second alignment block 430) and the selection block 480 (which corresponds to the selection block 440) will be omitted.

As illustrated in FIG. 14, bits DFE2 and DFE4, which are output from the selection block 480 in response to the second selection signal SS2 from time point T6, respectively represent bits D6 and D2. Additionally, bits DFO1 and DFO3, which are output from the selection block 480 in response to the first selection signal SS1 from a time point after time point T6, respectively represent bits D8 and D4. Therefore, the 4 data bits D2, D4, D6 and D8 in the second data sequence DSF are aligned in parallel from the time point after time point T6, and respective durations of the 4 data bits D2, D4, D6, and D8 may be 2 tCK.

Figure 15:
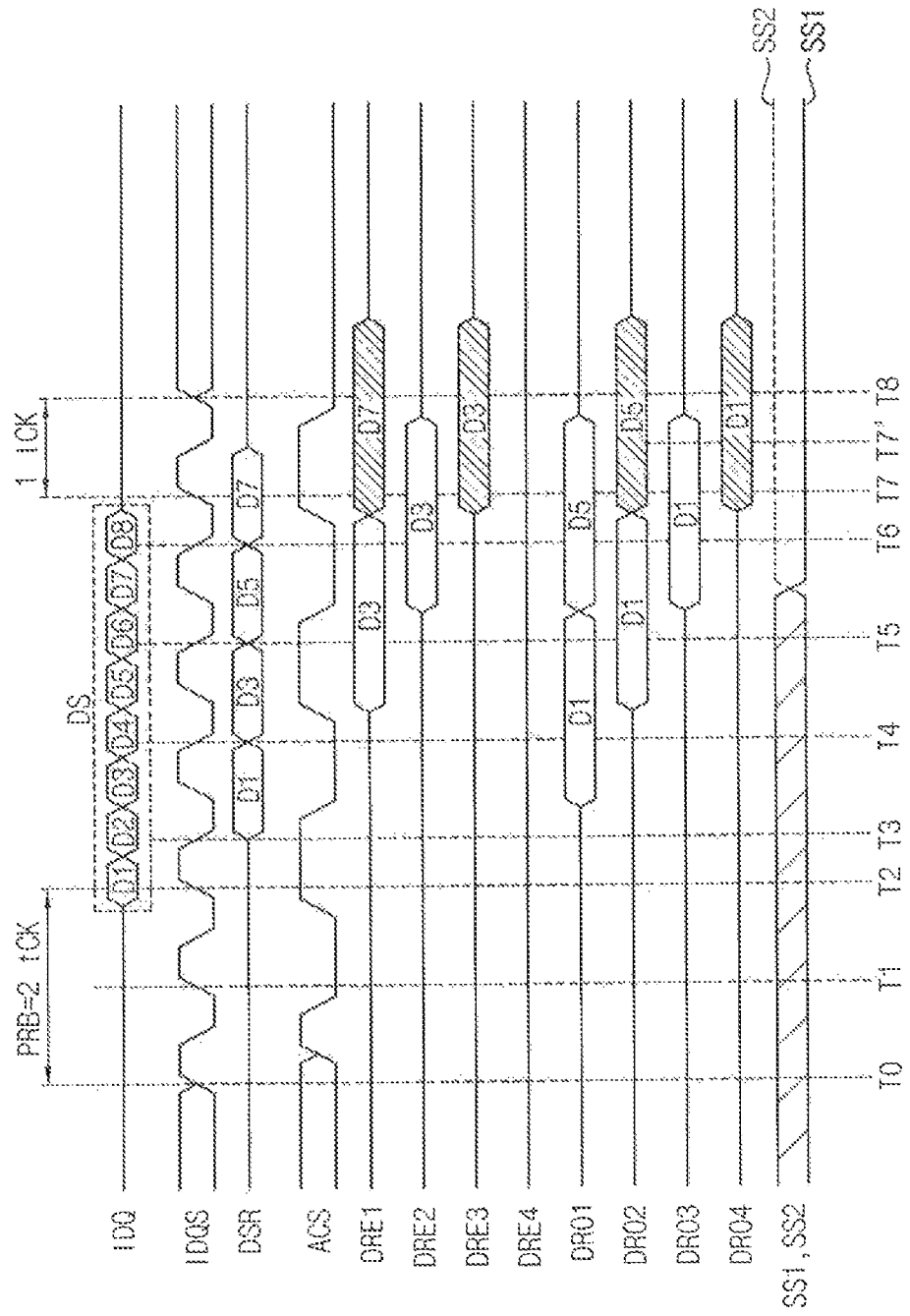
FIG. 15 is a timing diagram illustrating an operation of the first alignment circuit of FIG. 11 according to an exemplary embodiment of the inventive concept.

FIG. 15 is a timing diagram illustrating an operation of the first alignment circuit of FIG. 11 according to an exemplary embodiment of the inventive concept.

In FIG. 15, it is assumed that the alignment control signal ACS has a high level at a rising edge of the internal data strobe signal IDQS at time point T2 when the data sampling circuit 340 samples the first bit D1 of the data sequence DS.

The operation of the first alignment circuit 410 of FIG. 15 is substantially similar to the operation of the first alignment circuit 410 of FIG. 13. The operation of the first alignment circuit 410 of FIG. 15 differs from the operation of the first alignment circuit 410 of FIG. 13 in that the second alignment block 430 receives the bit D1 at time point T3 and the first alignment block 420 receives the bit D3 at time point T4.

As illustrated in FIG. 15, bits DRE1 and DRE3, which are output from the selection block 440 in response to the first selection signal SS1 from time point T6, respectively represent bits D7 and D3. Additionally, bits DRO2 and DRO4, which are output from the selection block 440 in response to the second selection signal SS2 from a time point after time point T6, respectively represent bits D5 and D1. Therefore, the 4 data bits D1, D3, D5 and D7 in the first data sequence DSR are aligned in parallel from the time point after time point T6, and respective durations of the 4 data bits D1, D3, D5, and D7 may be 2 tCK.

Figure 16:
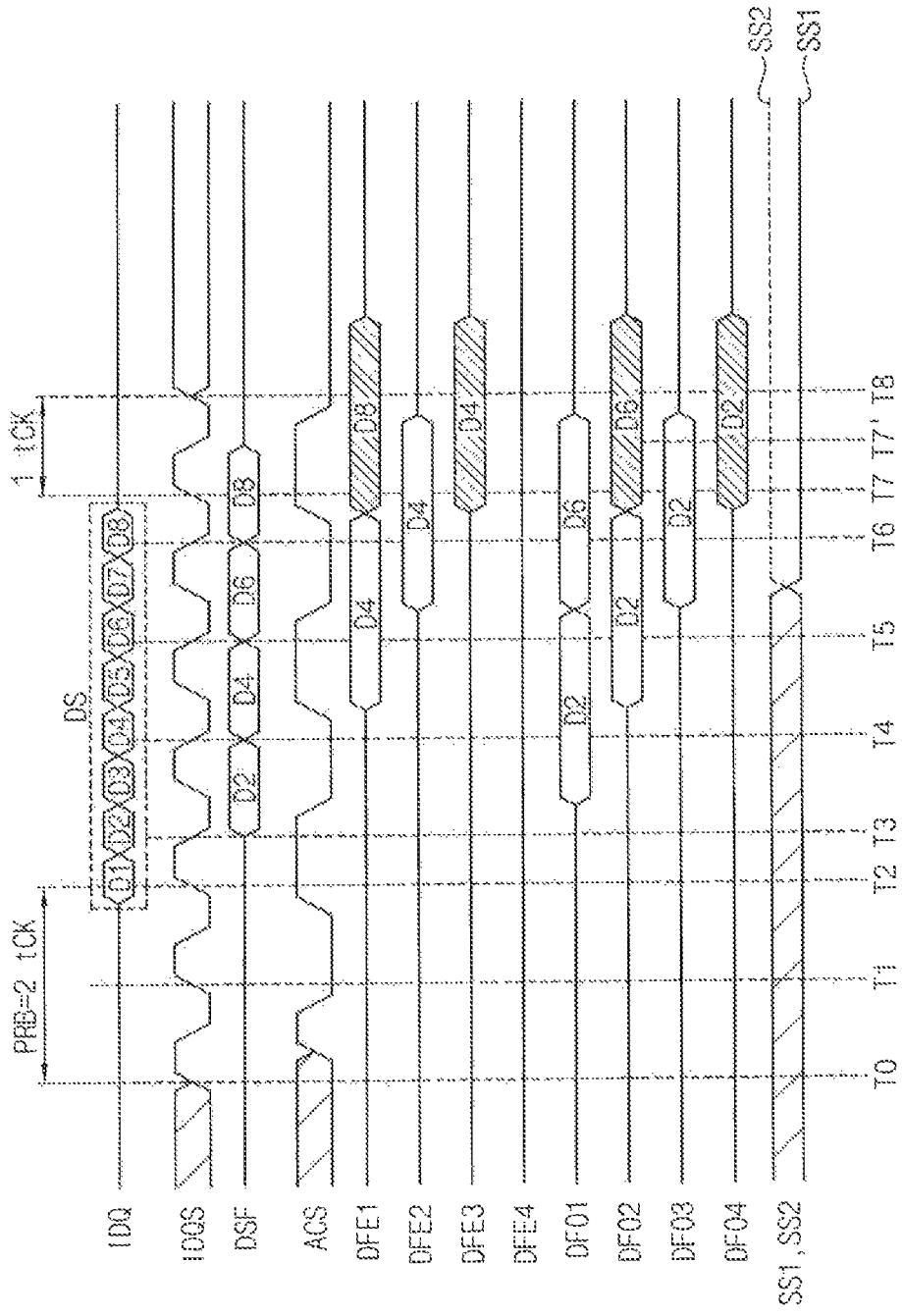
FIG. 16 is a timing diagram illustrating an operation of the second alignment circuit of FIG. 12 according to an exemplary embodiment of the inventive concept.

FIG. 16 is a timing diagram illustrating an operation of the second alignment circuit of FIG. 12 according to an exemplary embodiment of the inventive concept.

In FIG. 16, it is also assumed that the alignment control signal ACS has a high level at a rising edge of the internal data strobe signal IDQS at time point T2 when the data sampling circuit 340 samples the first bit D1 of the data sequence DS.

The operation of the second alignment circuit 450 of FIG. 16 is substantially similar to the operation of the second alignment circuit 450 of FIG. 14. The operation of the second alignment circuit 450 of FIG. 16 differs from the operation of the second alignment circuit 450 of FIG. 14 in that the second alignment block 470 receives the bit D2 at time point T3 and the first alignment block 460 receives the bit D4 at time point T4.

As illustrated in FIG. 16, bits DFE1 and DFE3, which are output from the selection block 480 in response to the first selection signal SS1 from a time point after time point T6, respectively represent bits D8 and D4. Additionally, bits DFO2 and DFO4, which are output from the selection block 480 in response to the second selection signal SS2 from the time point after time point T6, respectively represent bits D6 and D2. Therefore, the 4 data bits D2, D4, D6 and D8 in the second data sequence DSF are aligned in parallel from the time point after time point T6, and respective durations of the 4 data bits D2, D4, D6, and D8 may be 2 tCK.

Figure 17:
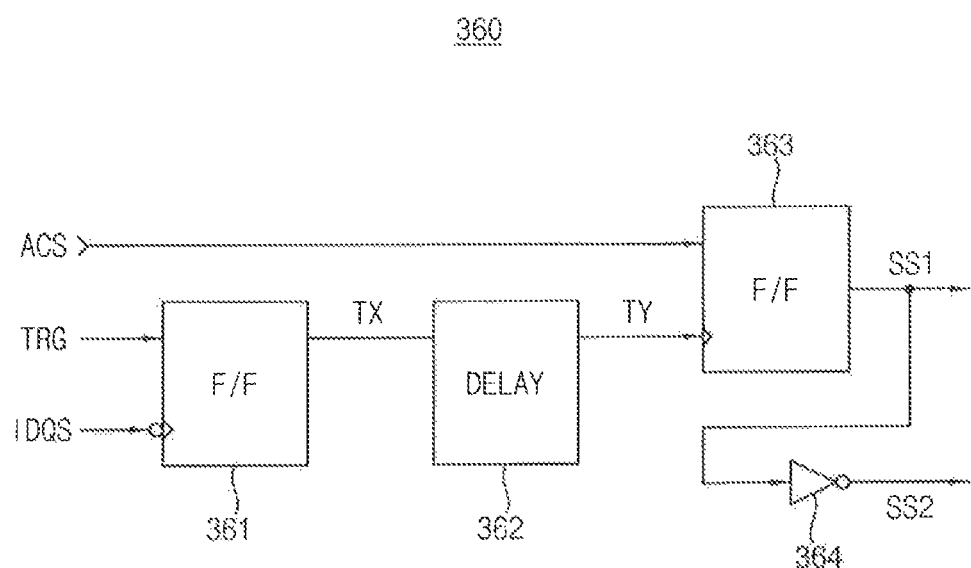
FIG. 17 is a block diagram illustrating a selection signal generator in the data alignment circuit of FIG. 7 according to an exemplary embodiment of the inventive concept.

FIG. 17 is a block diagram illustrating the selection signal generator in the data alignment circuit of FIG. 7 according to an exemplary embodiment of the inventive concept.

Referring to FIG. 17, the selection signal generator 360 may include a first sampler 361, a delay element 362, a second sampler 363 and an inverter 364. The first sampler 361 may be a falling edge-triggered flip-flop and the second sampler 363 may be a rising edge-triggered flip-flop.

The first sampler 361 samples the trigger signal TRG that prearranges serial input of the data DQ, based on the internal data strobe signal IDQS, to provide a first output signal TX. The first sampler 361 may sample the trigger signal TRG at a falling edge of the internal data strobe signal IDQS. The delay element 362 delays the first output signal TX to provide a second output signal TY. The second sampler 363 samples the alignment control signal ACS based on the second output signal TY to output the first selection signal SS1. The inverter 364 inverts the first selection signal SS1 to output the second selection signal SS2.

Figure 18:
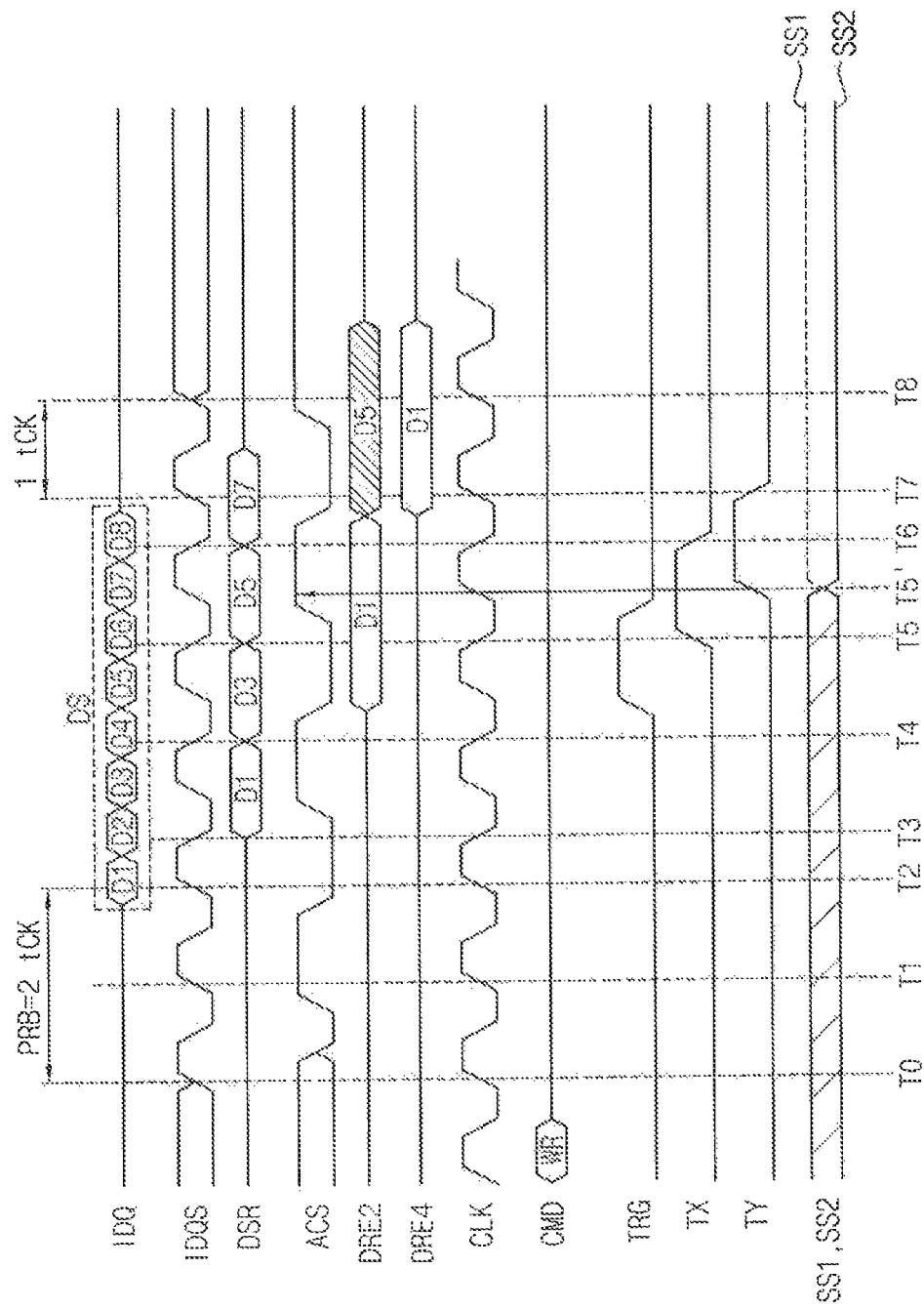
FIG. 18 is a timing diagram illustrating an operation of the selection signal generator of FIG. 17 according to an exemplary embodiment of the inventive concept.

FIG. 18 is a timing diagram illustrating an operation of the selection signal generator of FIG. 17 according to an exemplary embodiment of the inventive concept.

Referring to FIG. 18, the semiconductor memory device 200a may receive the clock signal CLK and the command CMD from the memory controller 100. The clock signal CLK is for transmitting the command CMD, and the command CMD may be synchronized with the clock signal CLK. The clock signal CLK and the data strobe signal DQS (or, the internal data strobe signal IDQS) may be not synchronized with each other. In other words, there may be a phase difference between clock signal CLK and data strobe signal DQS. For brevity, only a portion (e.g., bits DRE2 and DRE4) of the first data sequence DSR is illustrated in FIG. 18.

Referring to FIGS. 17 and 18, when the semiconductor memory device 200a receives a write command WR from the memory controller 100, the trigger signal TRIG may be generated from a signal that is generated by decoding the write command WR. The first sampler 361 may respond to the falling edge of the internal data strobe signal IDQS at time point T4, sample the trigger signal TRG, and thus, provide the first output signal TX at time point T5, for example. The delay element 362 may output the second output signal TY by delaying the first output signal TX for less than 1 tCK. The second output signal TY may be output at time point T5', for example. The second sampler 363 responds to the rising edge of the second output TY at time point T5', samples the alignment control signal ACS and outputs the first selection signal SS1. The inverter 364 inverts the first selection signal SS1 at time point T5' to output the second selection signal SS2. Since a logic level of the alignment control signal ACS at time point T5' (high) is opposite to a logic level of the alignment control signal ACS at time point T2 (*low*), the logic level of the alignment control signal ACS at time point T5 may reflect the logic level of the alignment control signal ACS at time point T2. As illustrated in FIGS. 15 and 16, when the alignment control signal ACS has the high level at time point T2, the first selection signal SS1 may have a low level at time point T5'.

The semiconductor memory device and the data alignment circuit according to exemplary embodiments of the inventive concept, divide the clock signal which toggles stably instead of dividing the data strobe signal directly, sample the divided clock signal, generate the alignment control signal and align serial data according to the alignment control signal. Therefore, the semiconductor memory device and the data alignment circuit may prevent the alignment control signal from entering into a meta-stable state. Accordingly, the semiconductor memory device and the data alignment circuit may increase operating stability and performance.

In an exemplary embodiment of the inventive concept, the data alignment circuit 330 may be included in the memory controller 100 in FIG. 2. The memory controller 100 may set an operation mode of the semiconductor memory device 200a to a burst read mode. In the burst read mode, the semiconductor memory device 200a may transmit, to the memory controller 100, a data sequence including a series of data through the data signal DQ. The data alignment circuit 330 in the memory controller 100 may receive the data sequence from the semiconductor memory device 200a and may align the data sequence in parallel.

Figure 19:
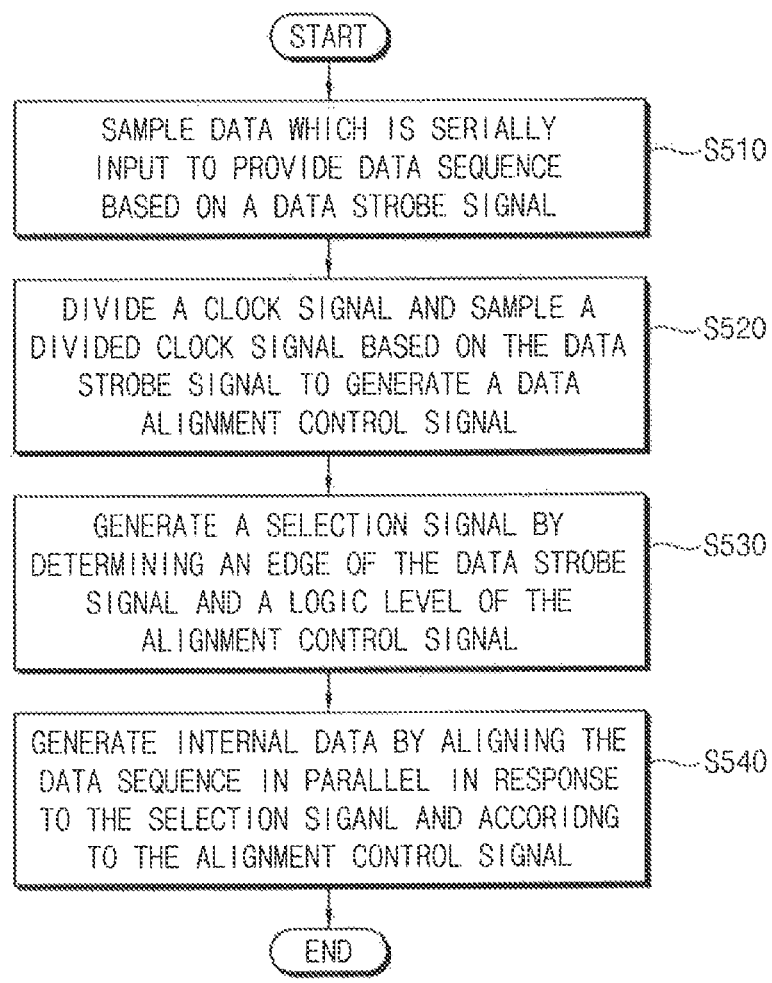
FIG. 19 is a flow chart illustrating a method of aligning data in a semiconductor memory device according to an exemplary embodiment of the inventive concept.

FIG. 19 is a flow chart illustrating a method of aligning data in a semiconductor memory device according to an exemplary embodiment of the inventive concept.

Referring to FIGS. 3 through 19, in a method of aligning data in a semiconductor memory device, the data sampling circuit 340 samples data DQ that is serially input based on a data strobe signal DQS to provide a data sequence DS (S510). The division circuit 350 divides a clock signal CLK, and samples a divided clock signal CLK_DV based on the data strobe signal DQS to generate an alignment control signal ACS (S520). The alignment control signal ACS may be generated by sampling the divided clock signal CLK_DV at a rising edge of the data strobe signal DQS.

The selection signal generator 360 generates a selection signal SS by determining an edge of the data strobe signal DQS and a logic level of the alignment control signal ACS (S530). The data alignment block 400 responds to the selection signal SS, and aligns the data sequence DS in parallel according to the alignment control signal ACS to generate internal data DTA.

Therefore, a method of aligning data in a semiconductor memory device according to an exemplary embodiment of the inventive concept may prevent the alignment control signal from entering into a meta-stable state, by dividing the clock signal instead of dividing the data strobe signal directly, sampling the divided clock signal, generating the alignment control signal and aligning serial data according to the alignment control signal.

Figure 20:
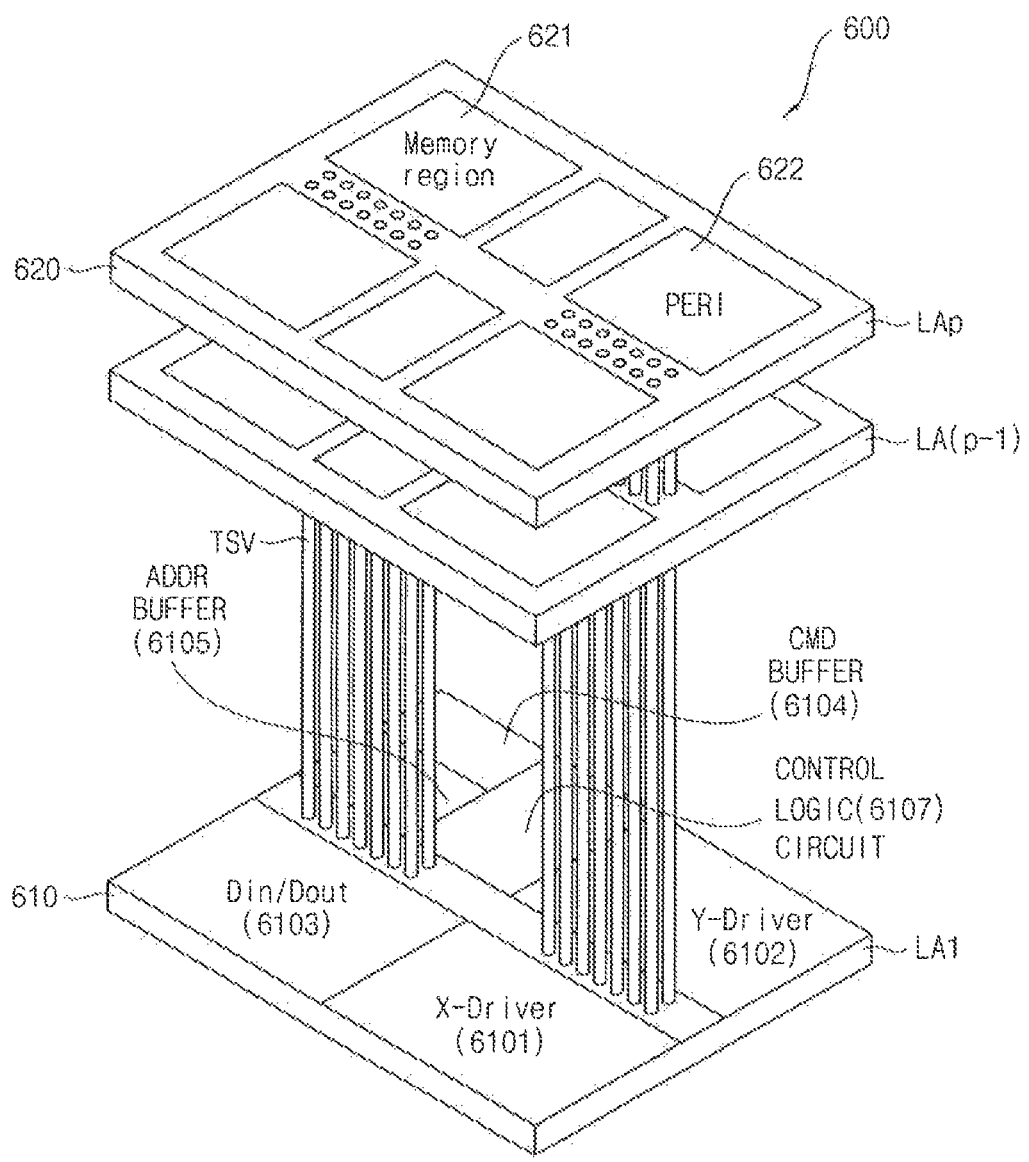
FIG. 20 is a structural diagram illustrating a semiconductor memory device according to an exemplary embodiment of the inventive concept.

FIG. 20 is a structural diagram illustrating a semiconductor memory device according to an exemplary embodiment of the inventive concept.

Referring to FIG. 20, a semiconductor memory device 600 may include first through p-th semiconductor integrated circuit layers LA1 through LAp (p is a natural number greater than two), in which the lowest first semiconductor integrated circuit layer LA1 is an interface or a control chip and the other semiconductor integrated circuit layers LA2 through LAp are slave chips including core memory chips. The first through p-th semiconductor integrated circuit layers LA1 through LAp may transmit and receive signals therebetween through through-silicon-vias (TSVs). The lowest first semiconductor integrated circuit layer LA1 as the interface or control chip may communicate with an external memory controller through a conductive structure formed on an external surface of the lowest first integrated circuit layer LA1, for example. A description will be made regarding the structure and an operation of the semiconductor memory device 600 by mainly using the first semiconductor integrated circuit layer LA1 or 610 as the interface or control chip and the p-th semiconductor integrated circuit layer LAp or 620 as the slave chip.

The first semiconductor integrated circuit layer 610 may include various peripheral circuits for driving a memory region 621 provided in the p-th semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output circuit (Din/Dout) 6103 for controlling input/ output of data, a command buffer (CMD BUFFER) 6104 for receiving a command CMD from the outside and buffering the command CMD, and an address buffer (ADDR BUFFER) 6105 for receiving an address from the outside and buffering the address. The memory region 621 may include a plurality of memory cells like those shown and described with reference to FIG. 4. The data input/output circuit 6103 may include the data alignment circuit 330 of FIG. 7.

The first semiconductor integrated circuit layer 610 may further include a control logic circuit 6107. The control logic circuit 6107 may control an access to the memory region 621 based on a command and an address signal from an external memory controller.

The p-th semiconductor integrated circuit layer 620 may include the memory region 621 and a peripheral circuit region 622 in which peripheral circuits for reading/writing data of the memory region 621, e.g., a row decoder, a column decoder, a bit line sense amplifier, etc. are arranged.

Therefore, the semiconductor memory device 600 may prevent an alignment control signal from entering into a meta-stable state, by dividing a clock signal instead of dividing a data strobe signal directly, sampling the divided clock signal, generating the alignment control signal and aligning serial data according to the alignment control signal. Accordingly, the semiconductor memory device 600 may increase operating stability and performance.

In addition, a three dimensional (3D) memory array is provided in the semiconductor memory device 600. The 3D memory array is monolithically formed in one or more physical levels of arrays of memory cells having an active area disposed above a silicon substrate and circuitry associated with the operation of those memory cells. The associated circuitry may be above or within the substrate. The term "monolithically" may mean that layers of each level of the array are directly deposited on the layers of each underlying level of the array. The following patent documents describe configurations for the 3D memory arrays, in which the 3D memory array is configured as a plurality of levels, with word-lines and/or bit-lines shared between levels: U.S. Pat. Nos. 7,679,133; 8,553,466; 8,654,587; 8,559,235; and U.S. Pat. Pub. No. 2011/0233648. The aforementioned patent documents are incorporated by reference herein in their entireties.

Figure 21:
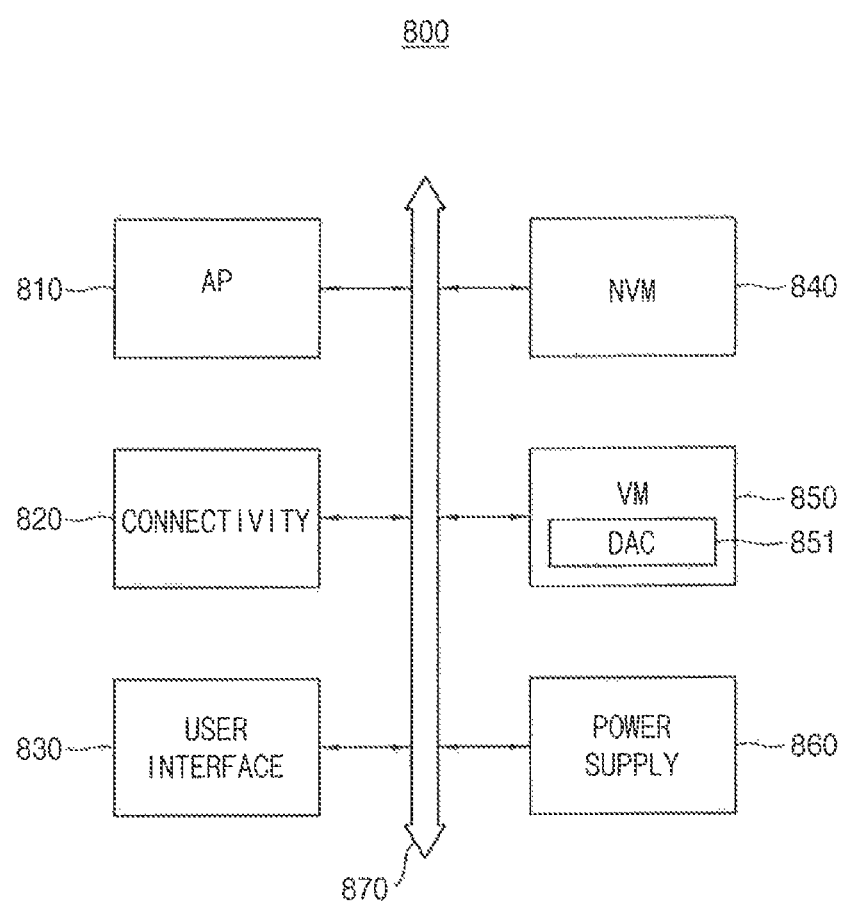
FIG. 21 is a block diagram illustrating a mobile system including a semiconductor memory device according to an exemplary embodiment of the inventive concept.

FIG. 21 is a block diagram illustrating a mobile system including a semiconductor memory device according to an exemplary embodiment of the inventive concept.

Referring to FIG. 21, a mobile system 800 may include an application processor 810, a connectivity unit 820, a user interface 830, a nonvolatile memory device 840, a volatile memory device 850 and a power supply 860. The components of the mobile system 800 may communicate with each other via a bus 870.

The application processor 810 may execute applications, such as a web browser, a game application, a video player, etc. The application processor 810 may include a single core or a plurality of-cores. The connectivity unit 820 may perform wired or wireless communication with an external device.

The volatile memory device 850 may store data processed by the application processor 810 or operate as a working memory. The volatile memory device 850 may include a data alignment circuit 851. The volatile memory device 850 may employ the semiconductor memory device 200a of FIG. 3. The data alignment circuit 851 may employ the data alignment circuit 330 of FIG. 7 and may prevent an alignment control signal from entering into a meta-stable state, by dividing a clock signal instead of dividing a data strobe signal directly, sampling the divided clock signal, generating the alignment control signal and aligning serial data according to the alignment control signal.

The nonvolatile memory device 840 may store a boot image for booting the mobile system 800. The user interface 830 may include at least one input device, such as a keypad, a touch screen, etc., and at least one output device, such as a speaker, a display device, etc. The power supply 860 may supply a power supply voltage to the mobile system 800.

In an exemplary embodiment of the inventive concept, the mobile system 800 and/or components of the mobile system 800 may be packaged in various forms.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A data alignment circuit of a semiconductor memory device, comprising:
   a data sampling circuit configured to receive a data sequence and an internal data strobe signal, wherein the data sampling circuit samples the data sequence based on the internal data strobe signal to generate first and second data sequences;
   a division circuit configured to receive a clock signal and the internal data strobe signal, divide the clock signal to produce a divided clock signal and output an alignment control signal by sampling the divided clock signal based on the internal data strobe signal; and
   a data alignment block configured to receive the first and second data sequences, and the alignment control signal, and align the first and second data sequences in parallel to output internal data,
   wherein the division circuit includes a frequency divider and a sampler, the frequency divider receives the clock signal directly from a clock buffer and divides a frequency of the clock signal to output the divided clock signal, and the sampler receives the divided clock signal directly from the frequency divider and samples the divided clock signal based on the internal data strobe signal to output the alignment control signal.

2. The data alignment circuit of claim 1, wherein the sampler samples the divided clock signal at a rising edge of the internal data strobe signal.

3. The data alignment circuit of claim 2, wherein the sampler is a flip flop.

4. The data alignment circuit of claim 1, wherein the data sampling circuit comprises:
   a first sampler configured to sample an internal data signal at a rising edge of the internal data strobe signal;
   a second sampler configured to sample the internal data signal at a falling edge of the internal data strobe signal and output the second data sequence; and
   a third sampler configured to sample a data sequence output from the first sampler at a falling edge of the internal data strobe signal and output the first data sequence.

5. The data alignment circuit of claim 4, wherein the first sampler is a rising edge-triggered flip flop, and each of the second and third samplers is a falling edge-triggered flip flop.

6. The data alignment circuit of claim 1, wherein the data alignment block comprises:
   a first alignment circuit configured to receive the first data sequence, and the alignment control signal, align the first data sequence in parallel in response to the alignment control signal, and output first parallel data; and
a second alignment circuit configured to receive the second data sequence, and the alignment control signal, align the second data sequence in parallel in response to the alignment control signal, and output second parallel data.

7. The data alignment circuit of claim 6, wherein the first alignment circuit comprises a first alignment block, a second alignment block and a selection block,
the first alignment block comprises a rising edge-triggered flip flop and a plurality of latches connected in series,
the second alignment block comprises a falling edge-triggered flip flop and a plurality of latches connected in series,
the selection block includes a plurality of multiplexers configured to receive first parallel bits from the first alignment block and second parallel bits from the second alignment block,
each of the multiplexers is configured to select one of corresponding bits of the first parallel bits and the second parallel bits in response to a first selection signal and a second selection signal, and
the multiplexers are configured to output each hit of the first parallel data.

8. The data alignment circuit of claim 1, further comprising:
a selection signal generator configured to receive the internal data strobe signal and the alignment control signal and output a selection signal having a logic level based on a logic level of the alignment control signal at an edge of the internal data strobe signal.

9. The data alignment circuit of claim 8, wherein the selection signal generator comprises a first sampler, a delay element, a second sampler and an inverter,
the first sampler samples a trigger signal based on the internal data strobe signal to provide a first output signal,
the delay element delays the first output signal to provide a second output signal, the second sampler samples the alignment control signal based on the second output signal to output a first selection signal, and
the inverter inverts the first selection signal to output the second selection signal.

10. A method of aligning data in a semiconductor memory device, comprising:
sampling serially input data based on a data strobe signal to provide first and second data sequences;
dividing, by a frequency divider, a clock signal to produce a divided clock signal and sampling, by a sampler, the divided clock signal based on the data strobe signal to generate an alignment control signal, wherein the clock signal is directly provided to the frequency divider from a clock buffer and the divided clock signal is directly provided to the sampler from the frequency divider; and
aligning the first and second data sequences in parallel based on the alignment control signal to generate internal data.

11. The method of claim 10, further comprising:
generating a selection signal based on a logic level of the alignment control signal at an edge of the data strobe signal.

12. The method of claim 10, wherein the alignment control signal is generated by sampling the divided clock signal at a rising edge of the data strobe signal.

13. The method of claim 10, wherein the first data sequence is sampled at rising, edges of the data strobe signal, and the second data sequence is sampled at failing edges of the data strobe signal.

14. The method of claim 10, wherein aligning the data sequence in parallel based on the alignment control signal, comprises:
aligning the first data in sequence in parallel using the alignment control signal, and outputting first parallel data that includes odd data bits, and
aligning the second data sequence in parallel using the alignment control signal, and outputting second parallel data that includes even data bits.

15. A data alignment circuit of a semiconductor memory device, comprising:
a divider configured to receive a clock signal directly provided from a clock buffer and output a divided clock signal;
a flip-flop configured to receive a data strobe signal and the divided clock signal, and sample the divided clock signal based on the data strobe signal to output an alignment control signal, wherein the divided clock signal is directly provided to the flip-flop from the divider, and
a sampling circuit configured to receive the alignment control signal and a serial data sequence, and align the data sequence in parallel using the alignment control signal.

16. The data alignment circuit of claim 15, wherein the data strobe signal is not divided.

17. The data alignment circuit of claim 15, wherein the alignment control signal has a stable state.

18. The data alignment circuit of claim 17, wherein the clock signal is turned on before the data strobe signal, and wherein the divided clock signal is stable.

19. The data alignment circuit of claim 15, wherein the semiconductor memory device is a dynamic random access memory (DRAM), and the DRAM is a low power double data rate (LPDDR) synchronous DRAM.

* * * * *